(12) United States Patent
Fuse et al.

(10) Patent No.: US 12,113,126 B2
(45) Date of Patent: Oct. 8, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kaori Fuse, Yokohama Kanagawa (JP); Keiko Kawamura, Yokohama Kanagawa (JP); Takako Motai, Yokohama Kanagawa (JP); Tomoko Matsudai, Tokyo (JP); Yoko Iwakaji, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 421 days.

(21) Appl. No.: 17/686,809

(22) Filed: Mar. 4, 2022

(65) Prior Publication Data
US 2023/0086935 A1     Mar. 23, 2023

(30) Foreign Application Priority Data
Sep. 22, 2021 (JP) ................. 2021-154468

(51) Int. Cl.
*H01L 29/739* (2006.01)
*H01L 29/868* (2006.01)

(52) U.S. Cl.
CPC ........ *H01L 29/7397* (2013.01); *H01L 29/868* (2013.01)

(58) Field of Classification Search
CPC ................................................. H01L 29/7397
(Continued)

(56) References Cited

U.S. PATENT DOCUMENTS 9,761,582 B2 * 9/2017 Gejo .................. H01L 29/0696
10,083,956 B2 * 9/2018 Ogura ................ H01L 29/0834
(Continued)

FOREIGN PATENT DOCUMENTS

JP    2014-187320 A    10/2014
JP    2015-177058 A    10/2015
(Continued)

OTHER PUBLICATIONS

Notice of Reasons for Refusal mailed May 28, 2024 in corresponding Japanese Patent Application No. 2021-154468, 9 pages (with Translation).

*Primary Examiner* — Igwe U Anya
(74) *Attorney, Agent, or Firm* — Kim & Stewart LLP

(57) ABSTRACT

A semiconductor device includes: a first electrode; a first semiconductor layer of first conductivity type provided on the first electrode; a second semiconductor layer of second conductivity type provided on the first semiconductor layer; a second electrode provided on the second semiconductor layer; a first trench reaching the first semiconductor layer from the second semiconductor layer; a first semiconductor region provided in the second semiconductor layer, the first semiconductor region being in contact with the first trench and the first semiconductor region having a higher concentration of impurities of second conductivity type than the second semiconductor layer; and a first insulating film provided in the second semiconductor layer and the first insulating film being in contact with the first semiconductor region.

16 Claims, 17 Drawing Sheets

(58) Field of Classification Search
USPC .......................................................... 257/288
See application file for complete search history.

(56) References Cited

U.S. PATENT DOCUMENTS

| | | |
|---|---|---|
| 10,629,685 B2 | 4/2020 | Naito |
| 10,763,345 B2 | 9/2020 | Murakawa et al. |
| 10,847,640 B2 | 11/2020 | Naito |
| 10,930,647 B2 | 2/2021 | Naito |
| 2014/0124832 A1 | 5/2014 | Ogura et al. |
| 2014/0284658 A1 | 9/2014 | Matsudai et al. |
| 2015/0155277 A1* | 6/2015 | Ogura ................... H01L 29/861 257/140 |
| 2015/0263148 A1 | 9/2015 | Ogura et al. |
| 2015/0263149 A1 | 9/2015 | Ogura et al. |
| 2016/0260807 A1* | 9/2016 | Soeno ................ H01L 29/0834 |
| 2017/0186884 A1 | 6/2017 | Ogura et al. |
| 2018/0226398 A1 | 8/2018 | Ogura et al. |
| 2018/0331210 A1 | 11/2018 | Mori |
| 2019/0252534 A1 | 8/2019 | Murakawa et al. |
| 2020/0135717 A1 | 4/2020 | Takahashi et al. |
| 2021/0296310 A1 | 9/2021 | Itokazu et al. |
| 2022/0293592 A1* | 9/2022 | Matsudai ............ H01L 29/8613 |

FOREIGN PATENT DOCUMENTS

| | | |
|---|---|---|
| JP | 2015-195366 A | 11/2015 |
| JP | 6082314 B2 | 2/2017 |
| JP | 2018-073911 A | 5/2018 |
| JP | 2018-190860 A | 11/2018 |
| JP | 2019-016804 A | 1/2019 |
| JP | 6674395 B2 | 4/2020 |
| JP | 2020-072137 A | 5/2020 |
| JP | 2020-074371 A | 5/2020 |
| JP | 2020-115596 A | 7/2020 |
| JP | 6721648 B2 | 7/2020 |
| JP | 2021-150528 A | 9/2021 |
| JP | 2022-139619 A | 9/2022 |
| WO | 2017/155122 A1 | 9/2017 |
| WO | 2018/052099 A1 | 3/2018 |

* cited by examiner

SEMICONDUCTOR DEVICE

CROSS-REFERENCE TO RELATED APPLICATION

This application is based upon and claims the benefit of priority from Japanese Patent Application No. 2021-154468, filed on Sep. 22, 2021, the entire contents of which are incorporated herein by reference.

FIELD

Embodiments described herein relate generally to a semiconductor device.

BACKGROUND

Developments are being made to improve the reverse recovery characteristics of the diode. In recent years, an insulated gate bipolar transistor (IGBT), a diode, and the like have been used as semiconductor devices used in power conversion devices such as an inverter. In general, the diode is connected in antiparallel to the IGBT and is used as a free wheeling diode. For this reason, the diode is sometimes called a FWD (free wheeling diode).

In order to improve the characteristics of a power conversion device such as an inverter, it is important to improve the characteristics of the FWD together with the improvement of the characteristics of the IGBT. The important characteristics of the FWD include on-voltage (that is, voltage drop in a conducting state), recovery time (that is, recovery current extinction time during reverse recovery), and a safe operating range during recovery (that is, a range where no destruction occurs even if a voltage is applied while recovery current is flowing). In addition, it is more desirable that current and voltage oscillations during recovery are small. Above all, it is important to increase the safe operating range during recovery while shortening the recovery time.

DETAILED DESCRIPTION

Figure 1:
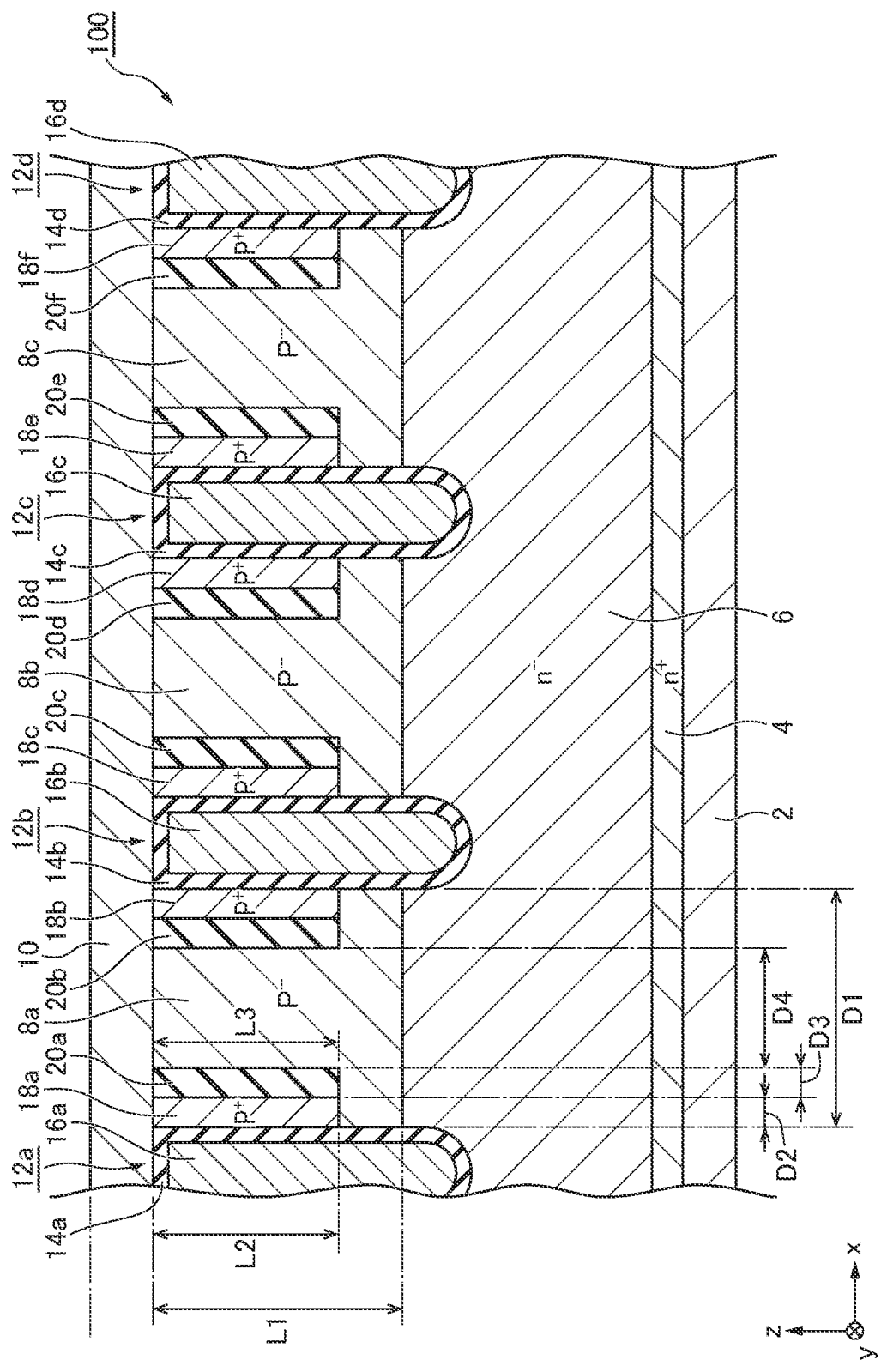
FIG. 1 is a schematic cross-sectional view of a semiconductor device of a first embodiment.

A semiconductor device of embodiments includes: a first electrode; a first semiconductor layer of first conductivity type provided on the first electrode; a second semiconductor layer of second conductivity type provided on the first semiconductor layer; a second electrode provided on the second semiconductor layer; a first trench reaching the first semiconductor layer from the second semiconductor layer; a first semiconductor region provided in the second semiconductor layer, the first semiconductor region being in contact with the first trench and the first semiconductor region having a higher concentration of impurities of second conductivity type than the second semiconductor layer; and a first insulating film provided in the second semiconductor layer and the first insulating film being in contact with the first semiconductor region.

Hereinafter, embodiments will be described with reference to the diagrams. In the following description, the same members and the like are denoted by the same reference numerals, and the description of the members and the like once described will be omitted as appropriate.

In the following description, when there are notations of $n^+$, n, $n^-$, $p^+$, p, and $p^-$, these indicate the relative high and low of the impurity concentration in each conductivity type. That is, $n^+$ indicates that the n-type impurity concentration is relatively higher than n, and $n^-$ indicates that the n-type impurity concentration is relatively lower than n. In addition, $p^+$ indicates that the p-type impurity concentration is relatively higher than p, and $p^-$ indicates that the p-type impurity concentration is relatively lower than p. In addition, $n^+$-type and $n^-$-type may be simply described as n-type, $p^+$-type and $p^-$-type may be simply described as p-type.

In this specification, in order to show the positional relationship of components and the like, a direction from a cathode electrode 2 toward a drift layer 6 is referred to as "upper", and the opposite direction is referred to as "lower". In this specification, the concepts of "upper" and "lower" do not necessarily indicate the relationship with the direction of gravity.

Hereinafter, a case where the first conductivity type is n type and the second conductivity type is p type will be described as an example.

First Embodiment

A semiconductor device of embodiments includes: a first electrode; a first electrode; a first semiconductor layer of first conductivity type provided on the first electrode; a second semiconductor layer of second conductivity type provided on the first semiconductor layer; a second electrode provided on the second semiconductor layer; a first trench reaching the first semiconductor layer from the second semiconductor layer; a first semiconductor region provided in the second semiconductor layer, the first semiconductor region being in contact with the first trench and the first semiconductor region having a higher concentration of impurities of second conductivity type than the second semiconductor layer; and a first insulating film provided in the second semiconductor layer and the first insulating film being in contact with the first semiconductor region.

Figure 2:
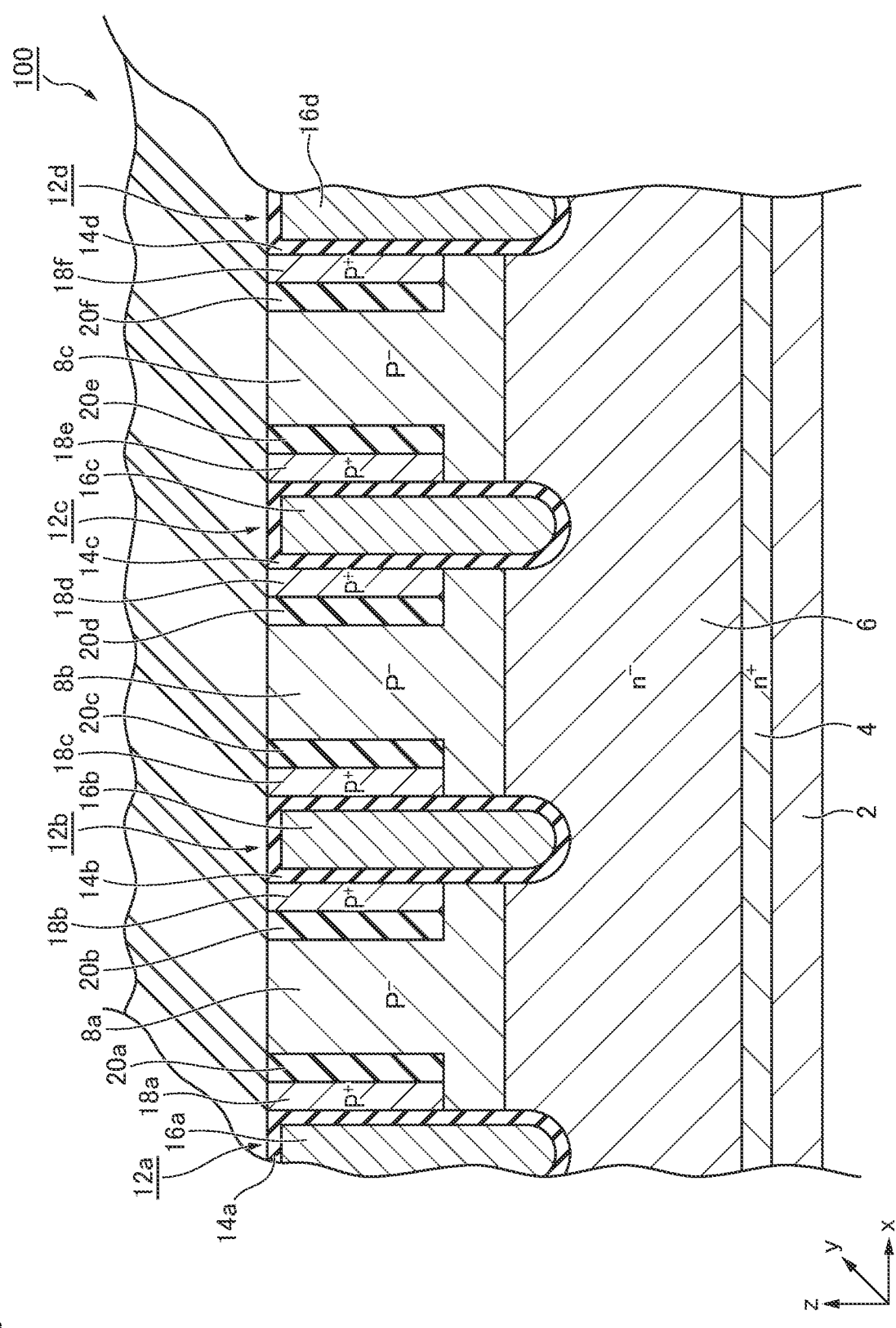
FIG. 2 is a schematic perspective view of the semiconductor device of the first embodiment.

FIG. 1 is a schematic cross-sectional view of a semiconductor device 100 of embodiments. FIG. 2 is a schematic perspective view of a main part of the semiconductor device 100 of embodiments. FIG. 2 shows the semiconductor device 100 shown in FIG. 1 with an anode electrode 10 removed for convenience of explanation.

The semiconductor device 100 is a PIN diode having a trench 12. For example, in a Reverse Conducting IGBT (RC-IGBT) having an IGBT and a PIN diode in one chip, the trench 12 similar to the trench 12 provided for the operation of the IGBT is provided in the semiconductor device 100. In addition, the semiconductor device 100 of embodiments is not limited to the PIN diode described above.

The semiconductor device 100 of embodiments will be described with reference to FIGS. 1 and 2.

The cathode electrode (an example of the first electrode) 2 is an electrode that functions as a cathode electrode of the PIN diode. The cathode electrode 2 contains a conductive material, such as aluminum (Al) or copper (Cu).

An $n^+$-type cathode layer 4 is provided on the cathode electrode 2. The cathode layer 4 is a layer that functions as a cathode layer of the PIN diode. For example, the cathode layer 4 preferably contains n-type impurities of $3\times10^{17}$ atoms/cm$^3$ or more.

An $n^-$-type drift layer (an example of the first semiconductor layer) 6 is provided on the cathode layer 4. The drift layer 6 is a layer that functions as a drift layer of the PIN diode. For example, the drift layer 6 preferably contains n-type impurities of $1\times10^{12}$ atoms/cm$^3$ or more and $1\times10^{15}$ atoms/cm$^3$ or less. The thickness of the drift layer 6 is, for example, 40 μm or more and 700 μm or less.

Here, an X direction (an example of the second direction), a Y direction (an example of the third direction) perpendicular to the X direction, and a Z direction (an example of the first direction) perpendicular to the X and Y directions are defined. The cathode electrode 2, the cathode layer 4, and the drift layer 6 have a layered shape provided in parallel with an XY plane parallel to the X and Y directions. The Z direction is a direction from the cathode electrode 2 toward the drift layer 6.

A $p^-$-type anode layer (an example of the second semiconductor layer) 8 is provided on the drift layer 6. The anode layer 8 is a layer that functions as an anode layer of the PIN diode. For example, the anode layer 8 preferably contains p-type impurities of $1\times10^{16}$ atoms/cm$^3$ or more and $5\times10^{17}$ atoms/cm$^3$ or less. The thickness of the anode layer 8 is, for example, 2 μm or more and 8 μm or less. FIG. 1 shows anode layers 8a, 8b, and 8c.

The anode electrode (an example of the second electrode) 10 is provided on the anode layer 8. The anode electrode 10 is an electrode that functions as an anode electrode of the PIN diode. The anode electrode 10 contains a conductive material, such as aluminum (Al) or copper (Cu). The anode electrode 10 makes Schottky contact with the anode layer 8, for example.

The trench (an example of the first trench) 12 is provided so as to extend from the anode layer 8 to the cathode electrode 2 in parallel to the Z direction and reach the drift layer 6. In FIG. 1, a trench 12a, a trench 12b, a trench 12c, and a trench 12d are provided as examples of the trench 12. The trenches 12a, 12b, 12c, and 12d extend in the Y direction as shown in FIG. 2. In embodiments, the trenches 12a, 12b, 12c, and 12d are first trenches.

An electrode 16 is provided in the trench 12. The electrode 16 contains, for example, polysilicon containing impurities. An insulating film 14 is provided around the electrode 16 in the trench 12 so as to surround the electrode 16. The insulating film 14 contains an insulating material, such as silicon oxide. In addition, the electrode 16 may not be provided in the trench 12.

A $p^+$-type semiconductor region (an example of the first semiconductor region) 18 is provided in the anode layer 8 so as to be in contact with a side wall of the trench 12 in the X direction. The semiconductor region 18 also serves as an anode layer of the PIN diode. In the semiconductor device 100, a semiconductor region 18a is provided in the anode layer 8a so as to be in contact with the side wall of the trench 12a in the X direction. A semiconductor region 18b is provided in the anode layer 8a so as to be in contact with the side wall of the trench 12b in the X direction. A semiconductor region 18c is provided in the anode layer 8b so as to be in contact with the side wall of the trench 12b in the X direction. A semiconductor region 18d is provided in the anode layer 8b so as to be in contact with the side wall of the trench 12c in the X direction. A semiconductor region 18e is provided in the anode layer 8c so as to be in contact with the side wall of the trench 12c in the X direction. A semiconductor region 18f is provided in the anode layer 8c so as to be in contact with the side wall of the trench 12d in the X direction. The trench 12b is provided between the semiconductor region 18b and the semiconductor region 18c in the X direction. The trench 12c is provided between the semiconductor region 18d and the semiconductor region 18e in the X direction. The semiconductor regions 18a, 18b, 18c, 18d, 18e, and 18f extend in the Y direction along the side wall of the trench 12 in the Y direction, for example, as shown in FIG. 2. The length of the anode layer 8 in the Z direction is longer than the length of the semiconductor region 18 in the Z direction. For example, the semiconductor region 18 preferably contains p-type impurities of $1\times10^{17}$ atoms/cm$^3$ or more and $1\times10^{21}$ atoms/cm$^3$ or less.

Here, the operation of the semiconductor device 100 will be described.

First, an electron current flowing from the cathode side to the anode side will be described.

In the on state (conducting state), a forward voltage is applied between the cathode and the anode. That is, a voltage is applied between the cathode and the anode so that the electric potential of the anode electrode 10 is higher than the electric potential of the cathode electrode 2.

Here, the $n^+$-type cathode layer 4 is in ohmic contact with the cathode electrode 2. Therefore, the electrons reach the $p^-$-type anode layer 8 from the $n^+$-type cathode layer 4 through the $n^-$-type drift layer 6.

The $p^-$-type anode layer 8 has a resistance contact or a Schottky junction with the anode electrode 10. That is, this is a resistance contact or a Schottky junction with a p-type semiconductor by a metal. For this reason, a region between the p⁻-type anode layer 8 and the anode electrode 10 serves as an energy barrier for holes, but does not serve as an energy barrier for electrons.

Therefore, electrons flow from the n⁺-type cathode layer 4 to the anode electrode 10 through the n⁻-type drift layer 6 and the p⁻-type anode layer 8.

Next, a hole current flowing from the anode side to the cathode side will be described.

As described above, the region between the p⁻-type anode layer 8 and the anode electrode 10 does not serve as an energy barrier for electrons. However, a region between the p⁺-type semiconductor region 18 and the p⁻-type anode layer 8 serve as an energy barrier for electrons. Therefore, electrons that have flowed to the p⁻-type anode layer 8 are less likely to flow to the p⁺-type semiconductor region 18.

As a result, the electrons flow from the cathode side to the anode side and then, when the electrons reach the vicinity of the p⁺-type semiconductor region 18, the electrons move laterally (X direction) below the p⁺-type semiconductor region 18.

Due to the movement of electrons in the vicinity of the p⁻-type anode layer 8, the lower portion of the p⁺-type semiconductor region 18 is biased so as to be a negative electrode with respect to the p⁺-type semiconductor region 18 in contact with the anode electrode 10, that is, the anode electrode 10.

Due to the bias formed between the lower portion of the p⁺-type semiconductor region 18 and the anode electrode 10, below the p⁺-type semiconductor region 18, the energy barrier for the holes between the p⁻-type anode layer 8 and the p⁺-type semiconductor region 18 is lowered. As a result, holes are injected from the p⁺-type semiconductor region 18 into the p⁻-type anode layer 8.

The hole current increases as the length of the p⁺-type semiconductor region 18 in the X direction or the contact area between the p⁺-type semiconductor region 18 and the anode electrode increases. In other words, the amount of injection of holes from the anode side is adjusted by the length or the contact area.

Thus, in the on state, holes flow from the anode side to the cathode side, and electrons flow from the cathode side to the anode side. Here, on the anode side, holes are injected from the p⁺-type semiconductor region 18, whereas the p⁻-type anode layer 8 contributes substantially to the emission of electrons. Therefore, the amount of injection of holes is suppressed as compared with a semiconductor device in which the p⁻-type anode layer 8 is not provided. As a result, since the number of holes discharged during recovery is reduced, the recovery operation can be speeded up and the recovery loss is reduced.

Next, an operation in the turn-off state (recovery operation) will be described.

In a state in which a forward voltage is applied between the cathode and the anode, a reverse voltage is applied between the cathode and the anode. Holes present in the n⁻-type drift layer 6 move to the anode electrode 10 side and flow to the anode electrode 10 through the p⁺-type semiconductor region 18, and electrons move to the cathode electrode 2 side and flows to the cathode electrode 2 through the n⁺-type cathode layer 4.

During recovery, when electrons flow to the cathode electrode 2 and holes flow to the anode electrode 10, a depletion layer extends to the n⁻-type drift layer 6 and the p⁻-type anode layer 8 with the junction between the p⁻-type anode layer 8 and the n⁻-type drift layer 6 as a starting point. As a result, the conduction between the cathode and the anode is gradually cut off.

However, in a PIN diode, electric field concentration generally occurs at a certain point of the pn junction during recovery, which may cause avalanche breakdown. In a structure having the trench 12 as in embodiments, the electric field at the bottom of the trench 12 increases to cause avalanche breakdown at the bottom of the trench 12. Due to the current concentration caused by the avalanche breakdown, thermal destruction or the like may occur to destruct the element.

Here, the holes generated by the avalanche breakdown at the bottom of the trench 12 also flow to the anode electrode 10 through the p⁺-type semiconductor region 18. Therefore, since the p⁺-type semiconductor region 18 becomes close to the bottom of the trench 12, that is, the length $L_2$ of the p⁺-type semiconductor region 18 in the Z direction increases, the discharge of holes is increased. As a result, it is possible to suppress the destruction of the element.

An insulating film (an example of the first insulating film) 20 is provided in the anode layer 8 so as to be in contact with the semiconductor region 18 in the X direction. As described above, the amount of injection of holes from the anode side is adjusted by the length of the p⁺-type semiconductor region 18 in the X direction or the contact area between the p⁺-type semiconductor region 18 and the anode electrode 10. However, when the length $L_2$ of the p⁺-type semiconductor region 18 in the Z direction increases as in embodiments, hole injection occurs on the side surface of the p⁺-type semiconductor region 18 due to the same effect as in the lower portion of the p⁺-type semiconductor region 18. For this reason, it is difficult to suppress the amount of hole injection. The insulating film 20 is provided to suppress injection of holes in the X direction in the semiconductor region 18.

In the semiconductor device 100, an insulating film 20a is provided in the anode layer 8a so as to be in contact with the semiconductor region 18a in the X direction. An insulating film 20b is provided in the anode layer 8a so as to be in contact with the semiconductor region 18b in the X direction. An insulating film 20c is provided in the anode layer 8b so as to be in contact with the semiconductor region 18c in the X direction. An insulating film 20d is provided in the anode layer 8b so as to be in contact with the semiconductor region 18d in the X direction. An insulating film 20e is provided in the anode layer 8c so as to be in contact with the semiconductor region 18e in the X direction. An insulating film 20f is provided in the anode layer 8c so as to be in contact with the semiconductor region 18f in the X direction. The trench 12b is provided between the insulating film 20b and the insulating film 20c. The trench 12d is provided between the insulating film 20d and the insulating film 20e. As shown in FIG. 2, the insulating films 20a, 20b, 20c, 20d, 20e, and 20f extend in the Y direction along the semiconductor region 18. The insulating film 20 contains an insulating material, such as silicon oxide, silicon nitride, or carbon.

Figure 3:
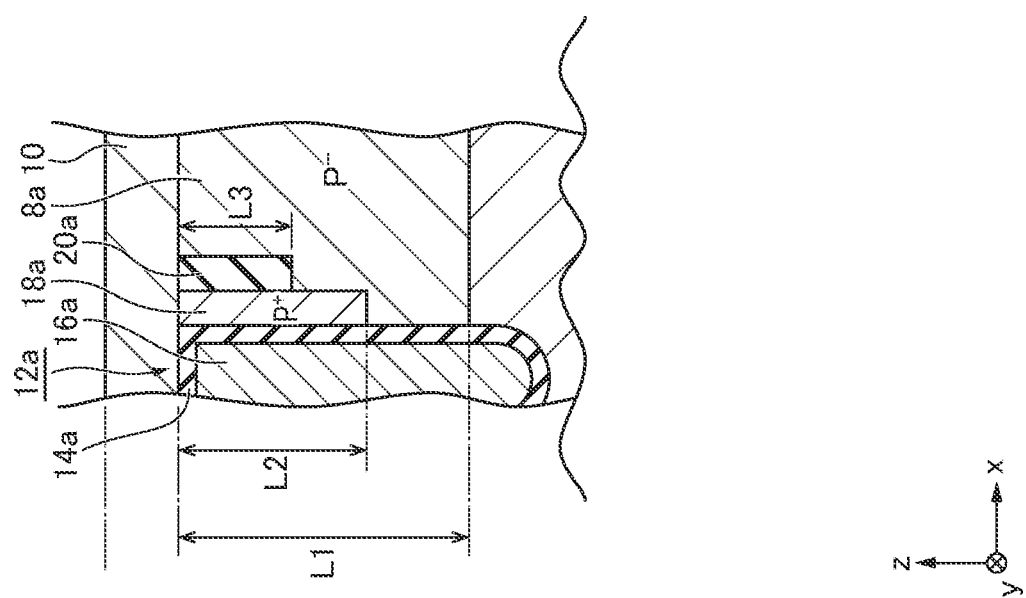
FIG. 3 is an example of a schematic cross-sectional view of a main part of the semiconductor device of the first embodiment.
Figure 4:
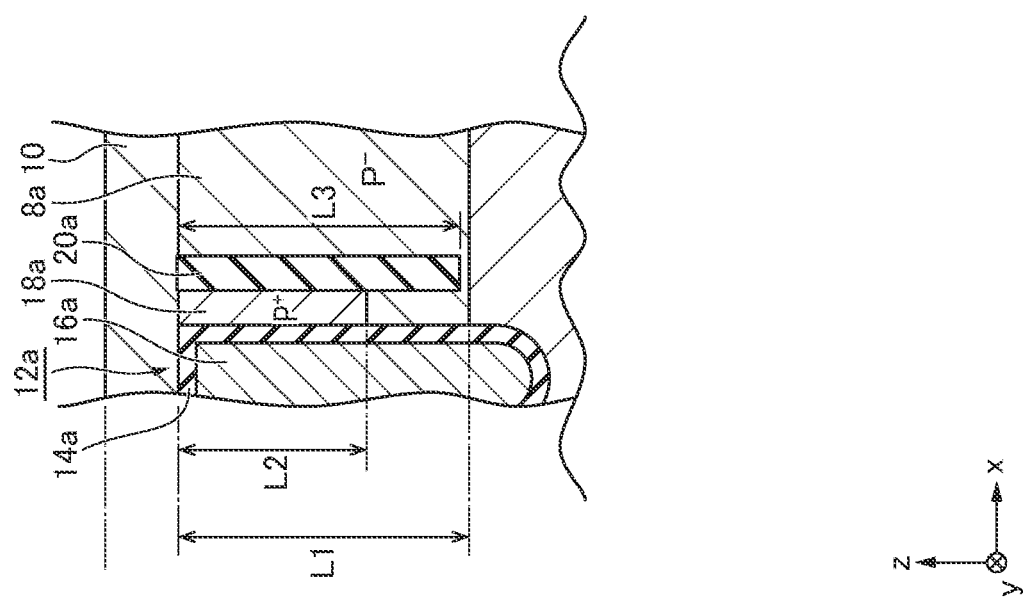
FIG. 4 is another example of the schematic cross-sectional view of the main part of the semiconductor device of the first embodiment.

The length $L_3$ of the insulating film 20 in the Z direction is preferably 0.6 times or more and 1.5 times or less the length $L_2$ of the semiconductor region 18 in the Z direction. In FIG. 1, a case of $L_2=L_3$ is shown. FIG. 3 is an example of a schematic cross-sectional view of a main part of the semiconductor device of embodiments. In FIG. 3, a case of $L_3=L_2\times0.6$ is shown. FIG. 4 is another example of a schematic cross-sectional view of a main part of the semiconductor device of embodiments. In FIG. 4, a case of $L_3=L_2\times1.5$ is shown.

The length $L_1$ of the anode layer 8 in the Z direction is preferably longer than the length $L_3$ of the insulating film 20 in the Z direction. Similarly, the length $L_1$ of the anode layer 8 in the Z direction is preferably longer than the length $L_2$ of the semiconductor region 18 in the Z direction.

As shown in FIG. 1, the distance between the trench 12a and the trench 12b in the X direction is assumed to be $D_1$. The length of the semiconductor region 18 in the X direction is assumed to be $D_2$. The length of the insulating film 20 in the X direction is assumed to be $D_3$. The distance between the insulating film 20a and the insulating film 20b in the X direction is assumed to be $D_4$. At this time, it is preferable that $D_2 < D_4$ in order to suppress the injection of holes from the lower portion of the p$^+$-type semiconductor region 18.

The semiconductor material used for the cathode layer 4, the drift layer 6, the anode layer 8 and the semiconductor region 18 is, for example, silicon (Si). However, the semiconductor material used for the cathode layer 4, the drift layer 6, the anode layer 8 and the semiconductor region 18 may be other semiconductor materials, such as silicon carbide (SiC), gallium nitride (GaN), and gallium arsenide (GaAs).

When silicon is used as a semiconductor material, for example, arsenic (As), phosphorus (P), or antimony (Sb) can be used as an n-type impurity, and B (boron) can be used as a p-type impurity.

Figure 5:
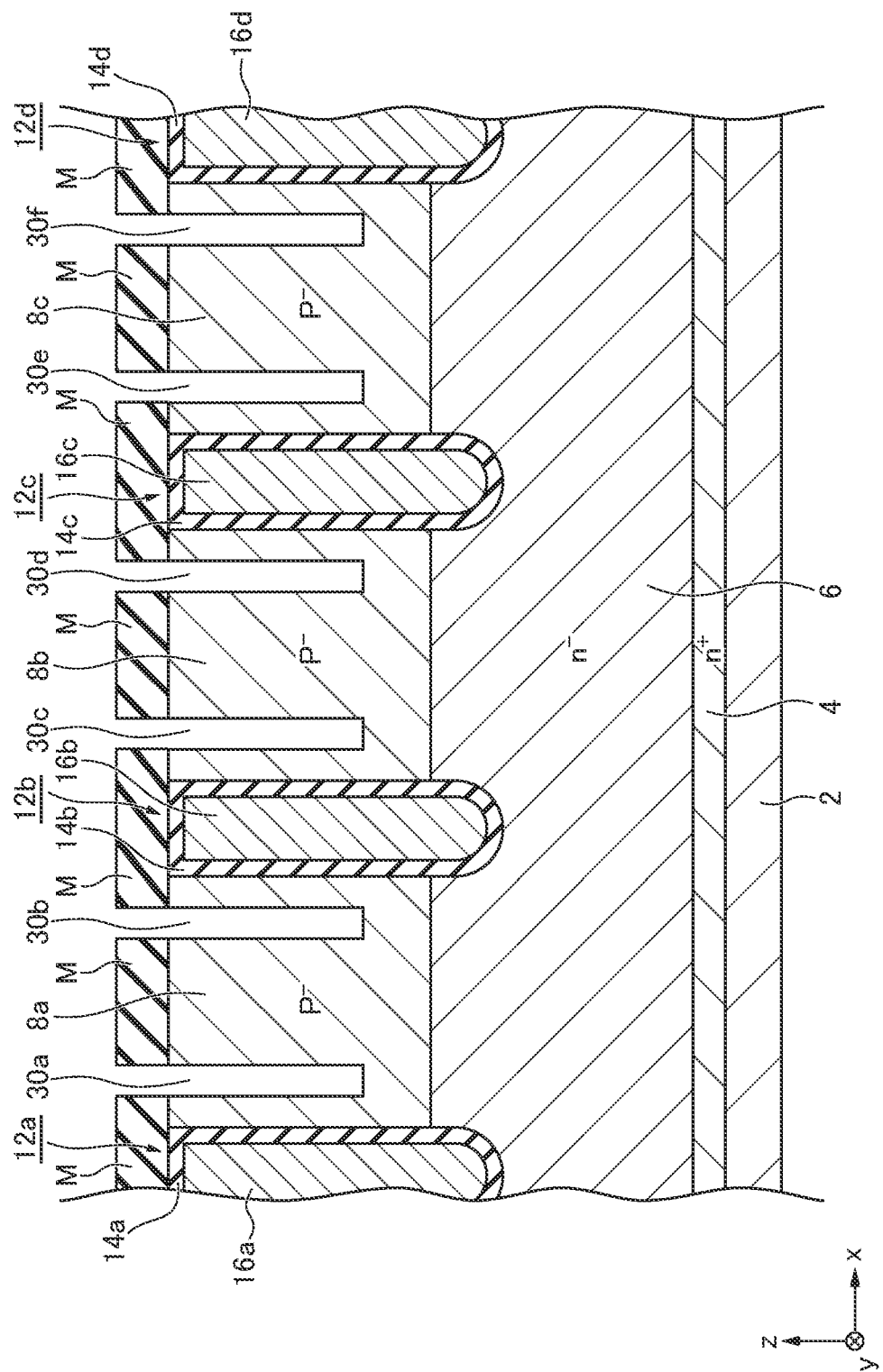
FIG. 5 is a schematic cross-sectional view showing a part of a process of manufacturing the semiconductor device of the first embodiment.
Figure 6:
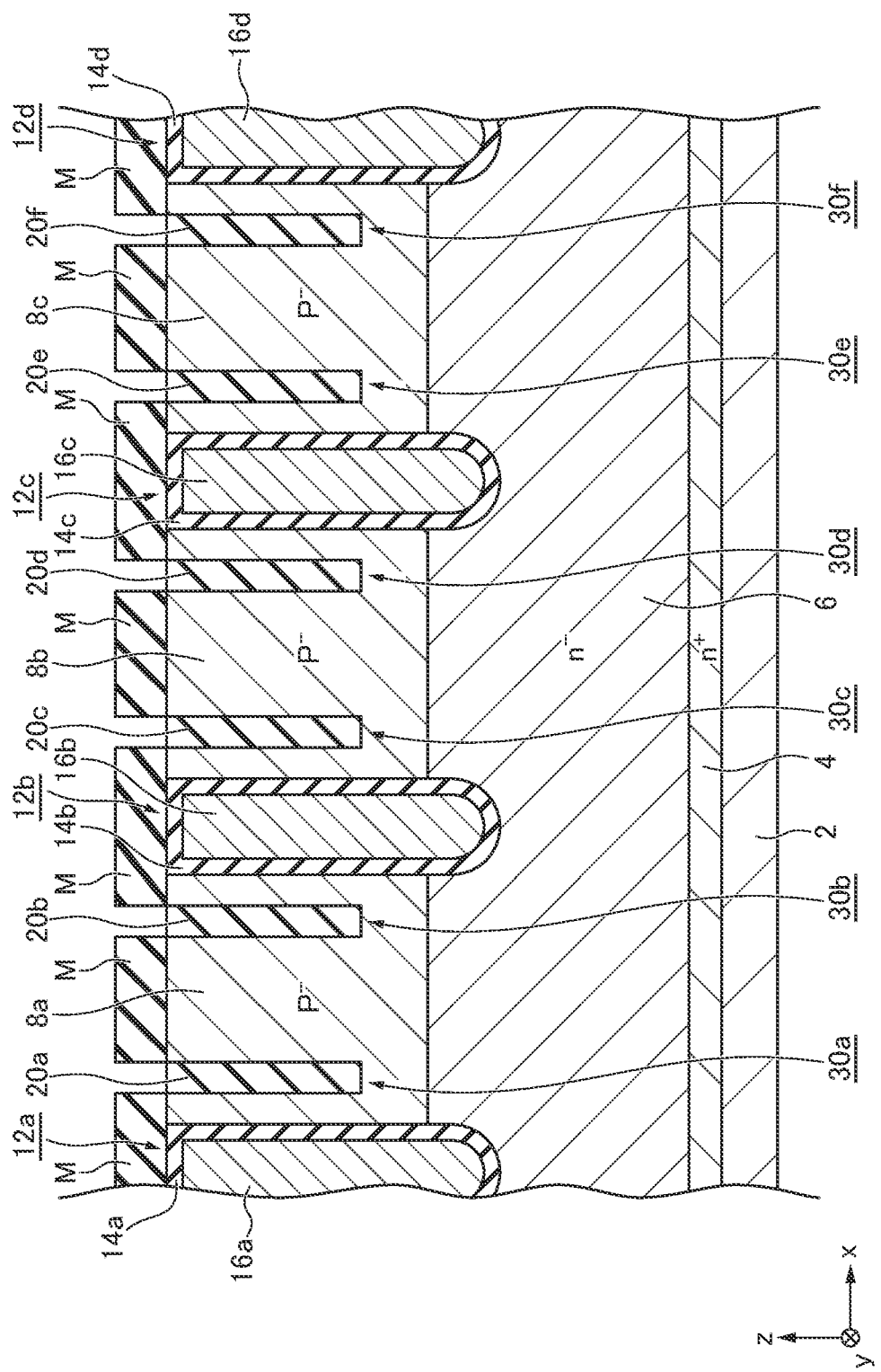
FIG. 6 is a schematic cross-sectional view showing a part of the process of manufacturing the semiconductor device of the first embodiment.
Figure 7:
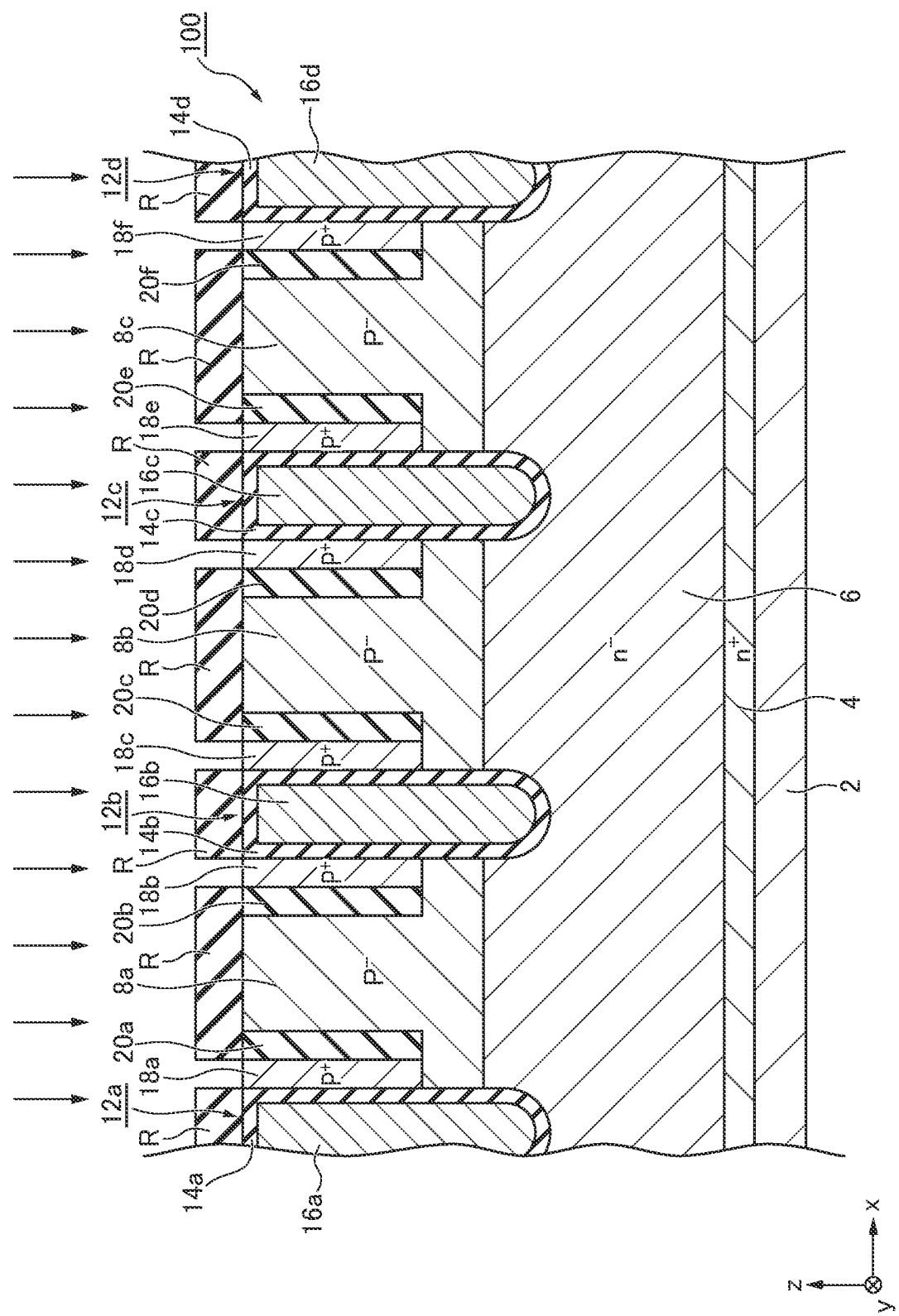
FIG. 7 is a schematic cross-sectional view showing a part of the process of manufacturing the semiconductor device of the first embodiment.

FIGS. 5 to 7 are schematic cross-sectional views showing a part of a process of manufacturing the semiconductor device of embodiments.

First, for example, the drift layer 6 is used as a semiconductor substrate. Then, the anode layer 8 is formed on the surface of the drift layer 6 by, for example, ion implantation. Then, the trench 12 is formed in the anode layer 8 by using, for example, photolithography and reactive ion etching (RIE). Then, the insulating film 14 and the electrode 16 are formed in the trench 12 by, for example, chemical vapor deposition (CVD). Then, a part of the insulating film 14 and a part of the electrode 16 are removed by, for example, etch back to expose the top of the anode layer 8, the top of the insulating film 14, and the top of the electrode 16. Then, a photomask M containing, for example, silicon oxide is formed on the anode layer 8, the insulating film 14, and the electrode 16.

Then, a groove 30 is formed in the anode layer 8 by, for example, RIE (FIG. 5). In FIG. 5, a groove 30a and a groove 30b are formed in the anode layer 8a. In addition, a groove 30c and a groove 30d are formed in the anode layer 8b. In addition, a groove 30e and a groove 30f are formed in the anode layer 8c.

In addition, in FIGS. 5, 6, and 7, the photomask M and a part of the insulating film 14 provided on the electrode 16 are shown as separate components. However, for example, a part of the insulating film 14 provided on the electrode 16 may be formed in the same manufacturing process as the photomask M. In addition, a part of the insulating film 14 provided on the electrode 16 may be formed by a manufacturing process different from that for the photomask M.

The distance between the groove 30a and the groove 30b, the distance between the groove 30c and the groove 30d, and the distance between the groove 30e and the groove 30f in the X direction are, for example, about 2 µm. The opening length of the groove 30 in the X direction is, for example, about 0.4 µm. The depth of the groove 30 in the Z direction is, for example, 1 µm. However, the distance between the grooves 30 in the X direction, the opening length of the groove 30 in the X direction, and the depth of the groove 30 in the Z direction are not limited to those described above.

Then, the insulating film 20 is formed in the groove 30 by, for example, CVD (FIG. 6). In FIG. 6, the insulating film 20a is formed in the groove 30a. The insulating film 20b is formed in the groove 30b. The insulating film 20c is formed in the groove 30c. The insulating film 20d is formed in the groove 30d. The insulating film 20e is formed in the groove 30e. The insulating film 20f is formed in the groove 30f.

Then, the photomask M is removed. Then, a photoresist R is formed on the anode layer 8, the insulating film 14, and the electrode 16. Then, the p$^+$-type semiconductor region 18 is formed between the trench 12 and the insulating film 20 by, for example, ion implantation (FIG. 7). In FIG. 7, the semiconductor region 18a is formed between the trench 12a and the insulating film 20a. The semiconductor region 18b is formed between the trench 12b and the insulating film 20b. The semiconductor region 18c is formed between the trench 12b and the insulating film 20c. The semiconductor region 18d is formed between the trench 12c and the insulating film 20d. The semiconductor region 18e is formed between the trench 12c and the insulating film 20e. The semiconductor region 18f is formed between the trench 12d and the insulating film 20f.

Then, the photoresist R is removed. Then, heat treatment is performed to activate impurities. Then, the cathode electrode 2 is formed below the cathode layer 4 and the anode electrode 10 is formed on the anode layer 8, the insulating film 14, and the electrode 16, thereby obtaining the semiconductor device 100 of embodiments.

Next, the function and effect of the semiconductor device of embodiments will be described.

In a semiconductor device using a diode having the trench 12, such as the semiconductor device of embodiments, when avalanche breakdown occurs at the bottom of the trench 12, it is conceivable to provide the p$^+$-type semiconductor region 18 having a predetermined depth on the side wall of the trench 12 in order to increase the discharge of holes generated at the bottom of the trench 12 to the anode electrode 10. In the p$^+$-type semiconductor region 18, the resistance to holes is reduced. Therefore, when a reverse voltage is applied, it becomes easy to remove the holes generated at the bottom of the trench 12 from the n$^-$-type drift layer 6 through the p$^+$-type semiconductor region 18 on the side wall of the trench 12.

However, by providing the p$^+$-type semiconductor region 18, a larger amount of holes are injected from the anode when a forward voltage is applied. When a reverse voltage is applied, a larger amount of holes need to be removed from the n$^-$-type drift layer 6. For this reason, there is a problem that the recovery loss increases by that amount.

Figure 8:
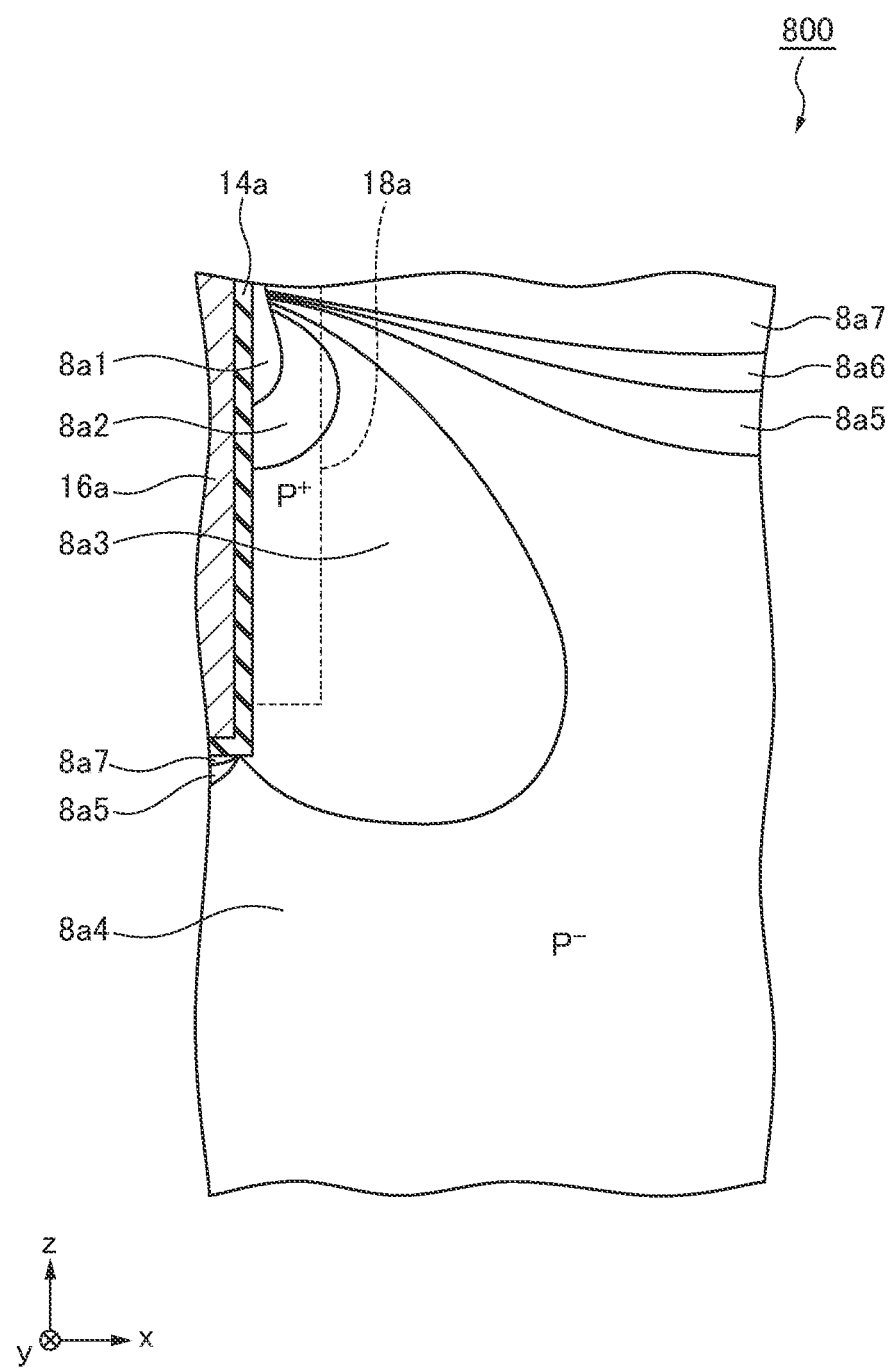
FIG. 8 is a schematic cross-sectional view of a main part of a semiconductor device as a comparative form of the first embodiment.

FIG. 8 is a schematic cross-sectional view showing a hole current when a forward voltage is applied in a main part of a semiconductor device 800 as a comparative form of embodiments. The insulating film 20 is not provided in the semiconductor device 800. When a forward current flows through the semiconductor device 800, the largest hole current flows in a region 8a$_1$ in the anode layer 8a. Then, the hole current decreases in the order of a region 8a$_1$, a region 8a$_2$, a region 8a$_3$, a region 8a$_4$, . . . . In addition, in the X direction, holes are injected from the p$^+$-type semiconductor region 18 into the p$^-$-type anode layer 8. It is thought that the increase in recovery loss can be suppressed by suppressing the injection of holes in the X direction.

Therefore, the semiconductor device 100 of embodiments includes the insulating film 20 provided in the anode layer 8 so as to be in contact with the semiconductor region 18.

Holes cannot be injected from the p$^+$-type semiconductor region 18 into the p$^-$-type anode layer 8 through the insulating film 20. Therefore, it is possible to provide a semiconductor device in which hole injection on the anode side is suppressed.

Figure 9A:
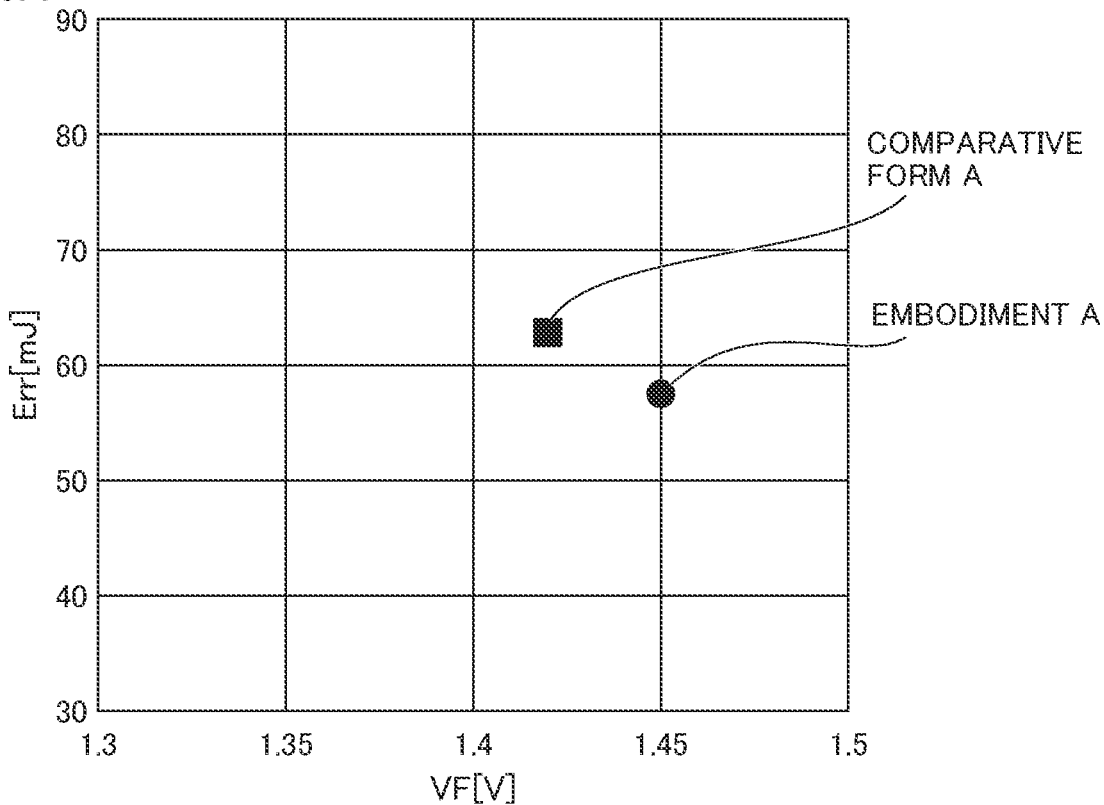
FIGS. 9A and 9B are schematic diagrams for describing the function and effect of the semiconductor device of the first embodiment.
Figure 9B:
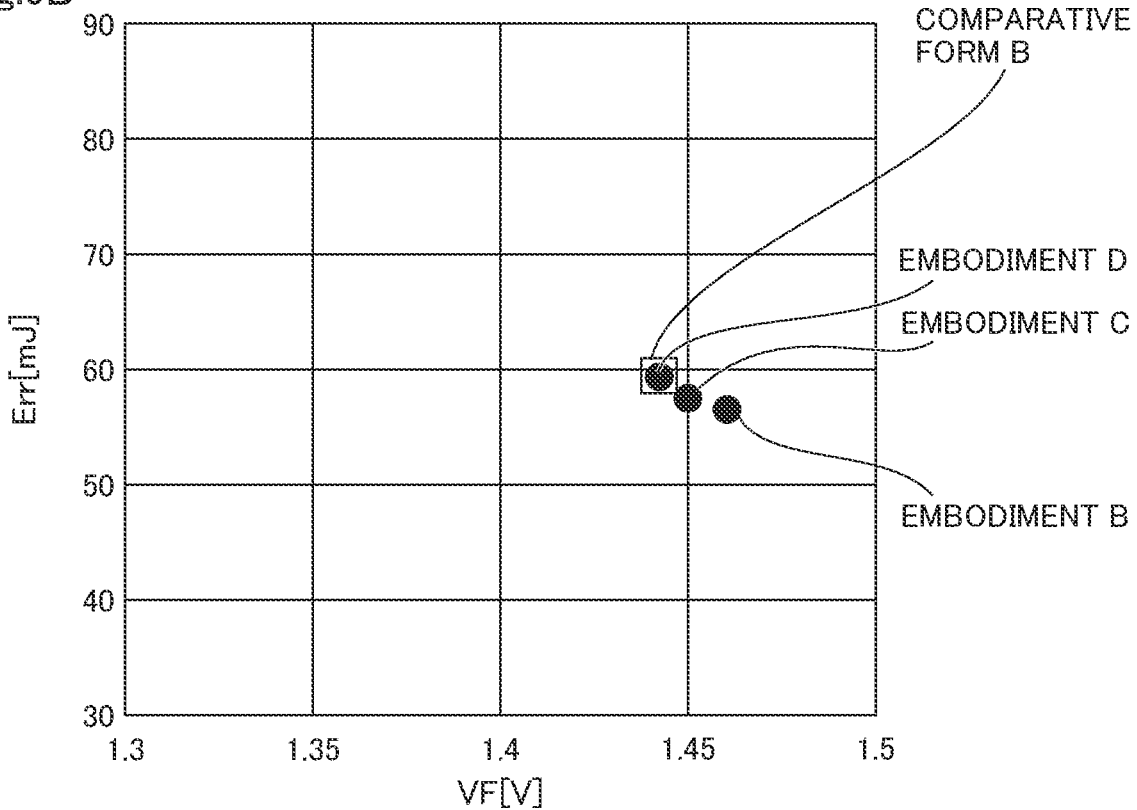

FIGS. 9A and 9B are schematic diagrams for describing the function and effect of the semiconductor device 100 of embodiments. FIGS. 9A and 9B are graphs showing a relationship between a recovery loss Err and a forward voltage $V_F$.

A semiconductor device according to a comparative form A of FIG. 9A includes the semiconductor region 18 on the side wall of the trench. The semiconductor device according to the comparative form A does not include the insulating film 20. On the other hand, a semiconductor device according to an embodiment A of FIG. 9A includes the semiconductor region 18 and the insulating film 20.

In the case of the semiconductor device according to the embodiment A, since hole injection is further suppressed, the forward voltage $V_F$ is high and the recovery loss Err is low. Therefore, in the semiconductor device 100 of embodiments, compared with the semiconductor device according to the comparative form A, hole injection on the anode side is suppressed and accordingly, it is possible to reduce the recovery loss Err.

The length $L_3$ of the insulating film 20 in the Z direction is preferably 0.6 times or more and 1.5 times or less the length $L_2$ of the semiconductor region 18 in the Z direction. When the length $L_3$ of the insulating film 20 in the Z direction is less than 0.6 times the length $L_2$ of the semiconductor region 18 in the Z direction, the length of the insulating film 20 is too short to sufficiently suppress the hole current in the X direction.

In a semiconductor device according to an embodiment B of FIG. 9B, the length $L_3$ of the insulating film 20 in the Z direction is 0.6 times the length $L_2$ of the semiconductor region 18 in the Z direction. In a semiconductor device according to an embodiment C of FIG. 9B, the length $L_3$ of the insulating film 20 in the Z direction is 1.0 times the length $L_2$ of the semiconductor region 18 in the Z direction. In a semiconductor device according to an embodiment D of FIG. 9B, the length $L_3$ of the insulating film 20 in the Z direction is 1.5 times the length $L_2$ of the semiconductor region 18 in the Z direction. In addition, FIG. 9B also shows a semiconductor device according to a comparative form B. The insulating film 20 is not provided in the semiconductor device according to the comparative form B.

As described above, when the length $L_3$ of the insulating film 20 in the Z direction is 0.6 times or more and 1.5 times or less the length $L_2$ of the semiconductor region 18 in the Z direction, hole injection is further suppressed, so that the forward voltage $V_F$ is high and the recovery loss Err is low.

The length $L_1$ of the anode layer 8 in the Z direction is preferably longer than the length $L_3$ of the insulating film 20 in the Z direction. This is because, when the length $L_3$ of the insulating film 20 in the Z direction is equal to or greater than the length $L_1$ of the anode layer 8, the insulating film 20 bites into the drift layer 6 and accordingly electric field concentration occurs at the lower tip of the insulating film 20. Similarly, the length $L_1$ of the anode layer 8 in the Z direction is preferably longer than the length $L_2$ of the semiconductor region 18 in the Z direction.

The insulating film 20 preferably contains silicon oxide. This is because the insulating film 20 can be easily generated.

When the length of the semiconductor region 18 in the X direction is $D_2$ and the distance between the insulating film 20a and the insulating film 20b in the X direction is $D_4$, it is preferable that $D_2 < D_4$. This is because, when $D_2 \geq D_4$, a larger amount of holes are injected from the p$^+$-type semiconductor region 18 and accordingly, the recovery loss increases when a reverse voltage is applied.

According to the semiconductor device of embodiments, it is possible to provide a semiconductor device in which the recovery loss is reduced and the safe operating range is increased.

Second Embodiment

A semiconductor device of embodiments is different from the semiconductor device of the first embodiment in that the semiconductor device of embodiments further includes: a plurality of first semiconductor regions provided in a second semiconductor layer so as to be in contact with a first trench and be separated from each other, each of the plurality of first semiconductor regions having a higher concentration of impurities of second conductivity type than the second semiconductor layer; and a plurality of first insulating films provided in the second semiconductor layer so as to be in contact with the plurality of first semiconductor regions and be separated from each other. Here, the description of the content overlapping the semiconductor device of the first embodiment will be omitted.

Figure 10:
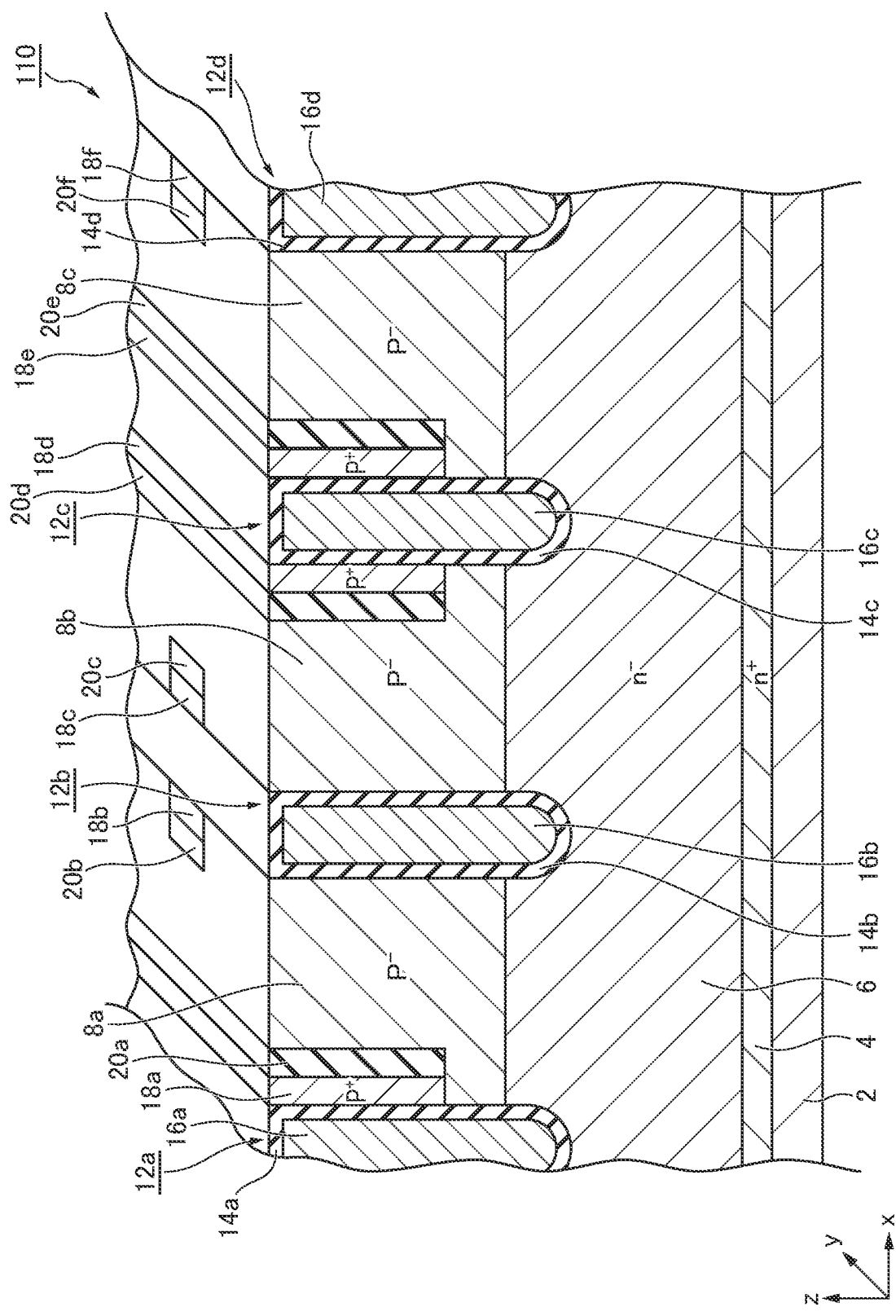
FIG. 10 is a schematic perspective view of a semiconductor device of a second embodiment.

FIG. 10 is a schematic perspective view of a semiconductor device 110 of embodiments.

The length of the semiconductor region 18b in the Y direction is shorter than the length of the semiconductor region 18a in the Y direction and the length of the insulating film 20a in the Y direction. In addition, the length of the insulating film 20b in the Y direction is shorter than the length of the semiconductor region 18a in the Y direction and the length of the insulating film 20a in the Y direction.

Similarly, the length of the semiconductor region 18c in the Y direction is shorter than the length of the semiconductor region 18a in the Y direction and the length of the insulating film 20a in the Y direction. In addition, the length of the insulating film 20c in the Y direction is shorter than the length of the semiconductor region 18a in the Y direction and the length of the insulating film 20a in the Y direction.

Similarly, the length of the semiconductor region 18f in the Y direction is shorter than the length of the semiconductor region 18a in the Y direction and the length of the insulating film 20a in the Y direction. In addition, the length of the insulating film 20f in the Y direction is shorter than the length of the semiconductor region 18a in the Y direction and the length of the insulating film 20a in the Y direction.

In addition, in FIG. 10, the length of the insulating film 20b in the Y direction is shown as being the same as the length of the semiconductor region 18b in the Y direction. However, the length of the insulating film 20b in the Y direction may be different from the length of the semiconductor region 18b in the Y direction. For example, the length of the insulating film 20b in the Y direction may be longer than the length of the semiconductor region 18b in the Y direction. In addition, the length of the insulating film 20b in the Y direction may be shorter than the length of the semiconductor region 18b in the Y direction. However, from the viewpoint of reducing the hole injection on the anode side, the length of the insulating film 20b in the Y direction is preferably longer than the length of the semiconductor region 18b in the Y direction. The same applies to the semiconductor region 18c, the insulating film 20c, the semiconductor region 18f, and the insulating film 20f.

In addition, for example, a plurality of semiconductor regions 18b separated from each other may be provided in contact with the side wall of the trench 12b along the Y direction. For example, a plurality of insulating films 20b separated from each other may be provided in contact with the plurality of semiconductor regions 18b along the Y direction. For example, a plurality of semiconductor regions 18c separated from each other may be provided on the side wall of the trench 12b along the Y direction. For example, a plurality of insulating films 20c separated from each other may be provided in contact with the plurality of semiconductor regions 18c along the Y direction. For example, a plurality of semiconductor regions 18f separated from each other may be provided on the side wall of the trench 12d along the Y direction. For example, a plurality of insulating films 20f separated from each other may be provided in contact with the plurality of semiconductor regions 18f along the Y direction. In such a case, the trench 12b is an example of a first trench. The plurality of semiconductor regions 18b and the plurality of insulating films 20b are examples of a plurality of first semiconductor regions and a plurality of first insulating films, respectively.

In addition, in FIG. 10, the semiconductor region 18 and the insulating film 20 extending in the Y direction, such as the semiconductor region 18a, the insulating film 20a, the semiconductor region 18d, the insulating film 20d, the semiconductor region 18e, and the insulating film 20e, and the semiconductor region 18 and the insulating film 20 each having a shorter length in the Y direction, such as the semiconductor region 18b, the insulating film 20b, the semiconductor region 18c, the insulating film 20c, the semiconductor region 18f, and the insulating film 20f, are shown. The order in which these are arranged in the X direction is not particularly limited to that shown in FIG. 10. In addition, FIG. 10 shows that a plurality of semiconductor regions 18 and a plurality of insulating films 20 each having a shorter length in the Y direction are provided, but the number of semiconductor regions 18 having a shorter length in the Y direction may be one and the number of insulating film 20 having a shorter length in the Y direction may be one.

In other words, at least a part of the trench 12b has a portion, which is not in contact with the semiconductor region 18b and the semiconductor region 18c in the X direction, in the anode layer 8. In addition, the trench 12b has a portion that is in contact with the semiconductor region 18b and the semiconductor region 18c in the X direction. In such a case, the trench 12b is an example of a second trench.

In other words, at least a part of the trench 12d has a portion, which is not in contact with the semiconductor region 18f in the X direction, in the anode layer 8. In addition, the trench 12d has a portion that is in contact with the semiconductor region 18f in the X direction.

In order to reduce the amount of holes injected into the semiconductor device and reduce the hole injection on the anode side, it is preferable to make the volume of the semiconductor region 18 as small as possible. Therefore, in the semiconductor device 110, the length of the semiconductor region 18b in the Y direction is made shorter. As a result, the volume of the semiconductor region 18 in the anode layer 8a is made smaller. In addition, in the anode layer 8b, the length of the semiconductor region 18c in the Y direction is made shorter. As a result, the volume of the semiconductor region 18 in the anode layer 8b is made smaller. In addition, in the anode layer 8c, the length of the semiconductor region 18f in the Y direction is made shorter. As a result, the volume of the semiconductor region 18 in the anode layer 8c is made smaller. In this manner, it is possible to provide a semiconductor device capable of maintaining a safe operating range while reducing the recovery loss.

The length of the insulating film 20b in the Y direction may be long enough to suppress hole injection from the $p^+$-type semiconductor region 18b in the X direction. For this reason, the length of the insulating film 20b in the Y direction is shorter than the length of the semiconductor region 18a and the length of the insulating film 20a in the Y direction. In addition, the same applies to the length of the insulating film 20c in the Y direction and the length of the insulating film 20f in the Y direction. In addition, by providing a plurality of semiconductor regions 18b, a plurality of insulating films 20b, a plurality of semiconductor regions 18c, a plurality of insulating films 20c, a plurality of semiconductor regions 18f, and a plurality of insulating films 20f, hole injection and hole diffusion from the $p^+$-type semiconductor region 18f can be more satisfactorily suppressed.

Also in the semiconductor device of embodiments, it is possible to provide a semiconductor device in which the recovery loss is reduced and the safe operating range is increased.

Third Embodiment

A semiconductor device of embodiments is different from the semiconductor devices of the first and second embodiments in that a second semiconductor region provided in contact with a second trench and having a higher concentration of impurities of second conductivity type than the second semiconductor layer is not provided in a second semiconductor layer and a second insulating film in contact with the second semiconductor region is not provided in the second semiconductor layer. Here, the description of the content overlapping the first and second embodiments will be omitted.

Figure 11:
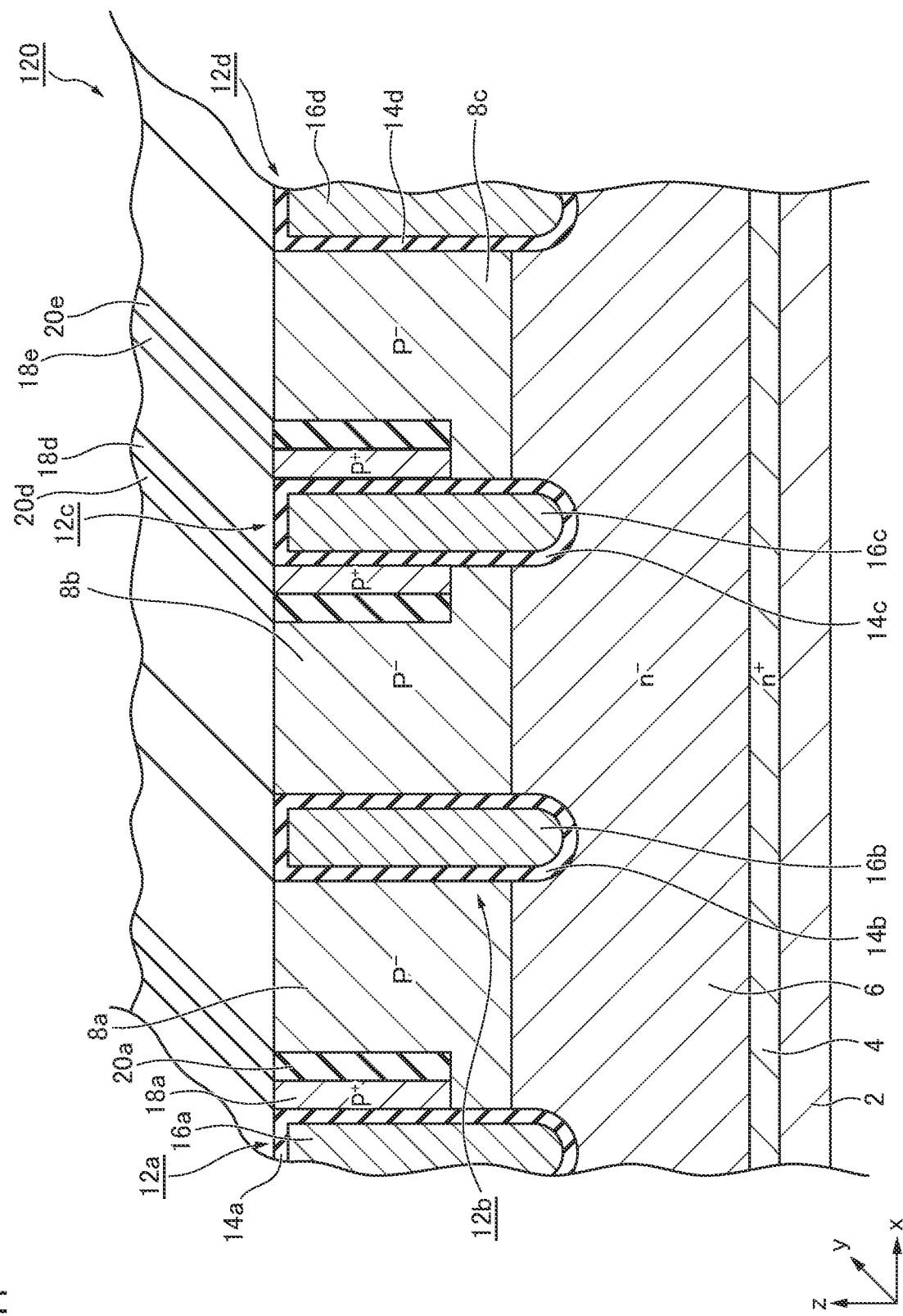
FIG. 11 is a schematic perspective view of a semiconductor device of a third embodiment.

FIG. 11 is a schematic perspective view of a semiconductor device 120 of embodiments. In embodiments, the trenches 12a and 12c will be described as examples of the first trench, and the trenches 12b and 12d will be described as examples of the second trench. Unlike the semiconductor device 100 and the semiconductor device 110, in the semiconductor device 120, the semiconductor region 18b (an example of the second semiconductor region) in contact with the side wall of the trench 12b, the semiconductor region 18c (an example of the second semiconductor region), and the semiconductor region 18f in contact with the side wall of the trench 12d are not provided. In addition, the insulating film 20b (an example of the second insulating film) in contact with the semiconductor region 18b, the insulating film 20c (an example of the second insulating film) in contact with the semiconductor region 18c, and the insulating film 20f in contact with the semiconductor region 18f are not provided.

In other words, at least a part of the trench 12b has a portion, which is not in contact with the semiconductor region 18b and the semiconductor region 18c in the X direction, in the anode layer 8. In addition, the trench 12b does not have a portion that is in contact with the semiconductor region 18b and the semiconductor region 18c in the X direction.

In other words, at least a part of the trench 12d has a portion, which is not in contact with the semiconductor region 18f in the X direction, in the anode layer 8. In addition, the trench 12d does not have a portion that is in contact with the semiconductor region 18f in the X direction.

In addition, the arrangement of the first trench (trenches 12a and 12c) and the second trench (trenches 12b and 12d) in the X direction is not limited to that shown in FIG. 11.

As described above, in order to reduce the amount of holes injected into the semiconductor device and reduce the hole injection on the anode side, it is preferable to make the volume of the semiconductor region 18 as small as possible. Therefore, the semiconductor device 120 includes the trench 12b in which the semiconductor region 18 is not provided. When the semiconductor region 18 is not provided, it is not necessary to provide the insulating film 20 in contact with the semiconductor region 18.

Also in the semiconductor device of embodiments, it is possible to provide a semiconductor device in which the recovery loss is reduced and the safe operating range is increased.

Fourth Embodiment

A semiconductor device of embodiments is different from the semiconductor device of the second embodiment in that the insulating film 20b in contact with the semiconductor region 18b extends in the Y direction. Here, the description of the content overlapping the first to third embodiments will be omitted.

Figure 12:
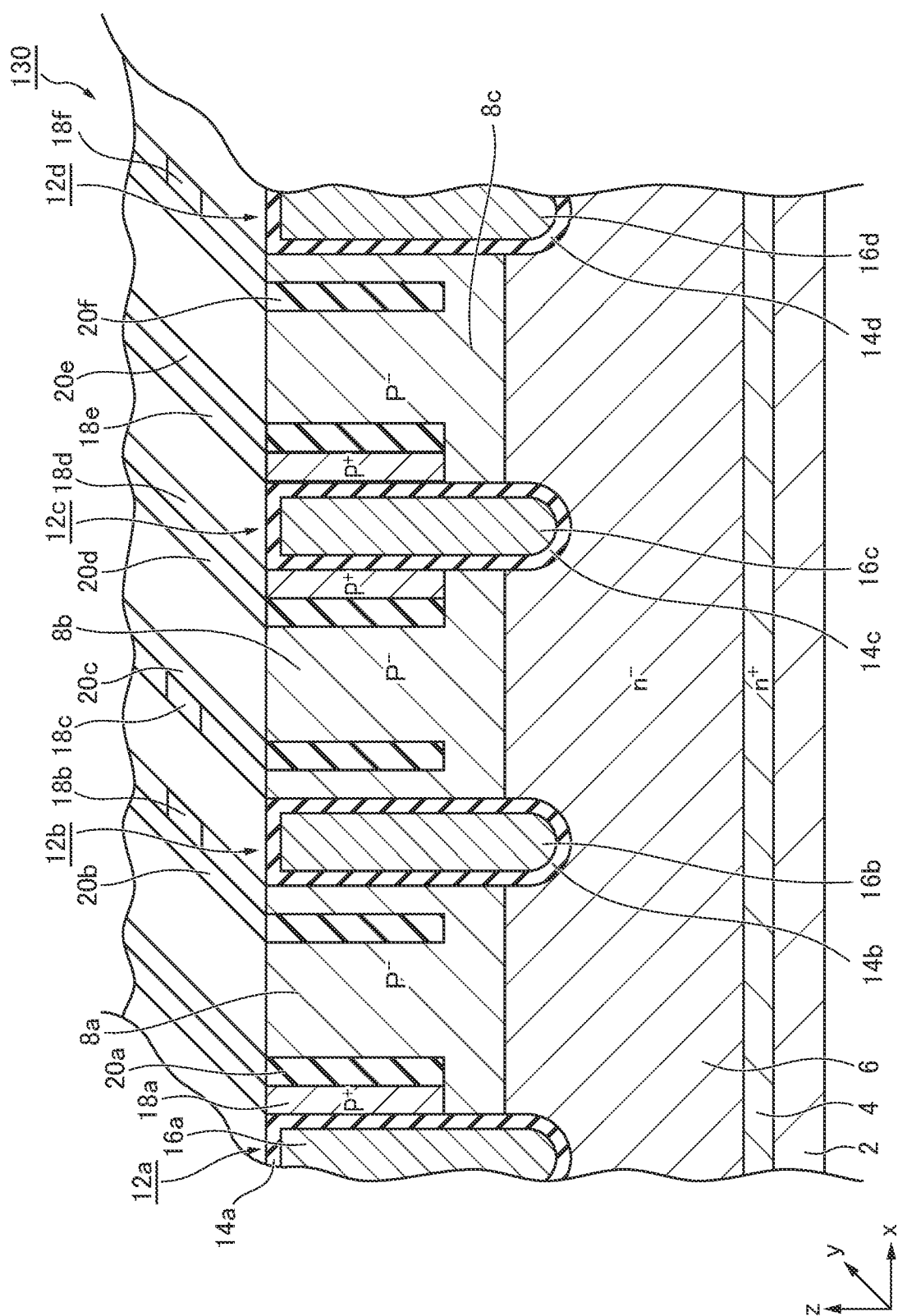
FIG. 12 is a schematic perspective view of a semiconductor device of a fourth embodiment.

FIG. 12 is a schematic perspective view of a semiconductor device 130 of embodiments.

Figure 13:
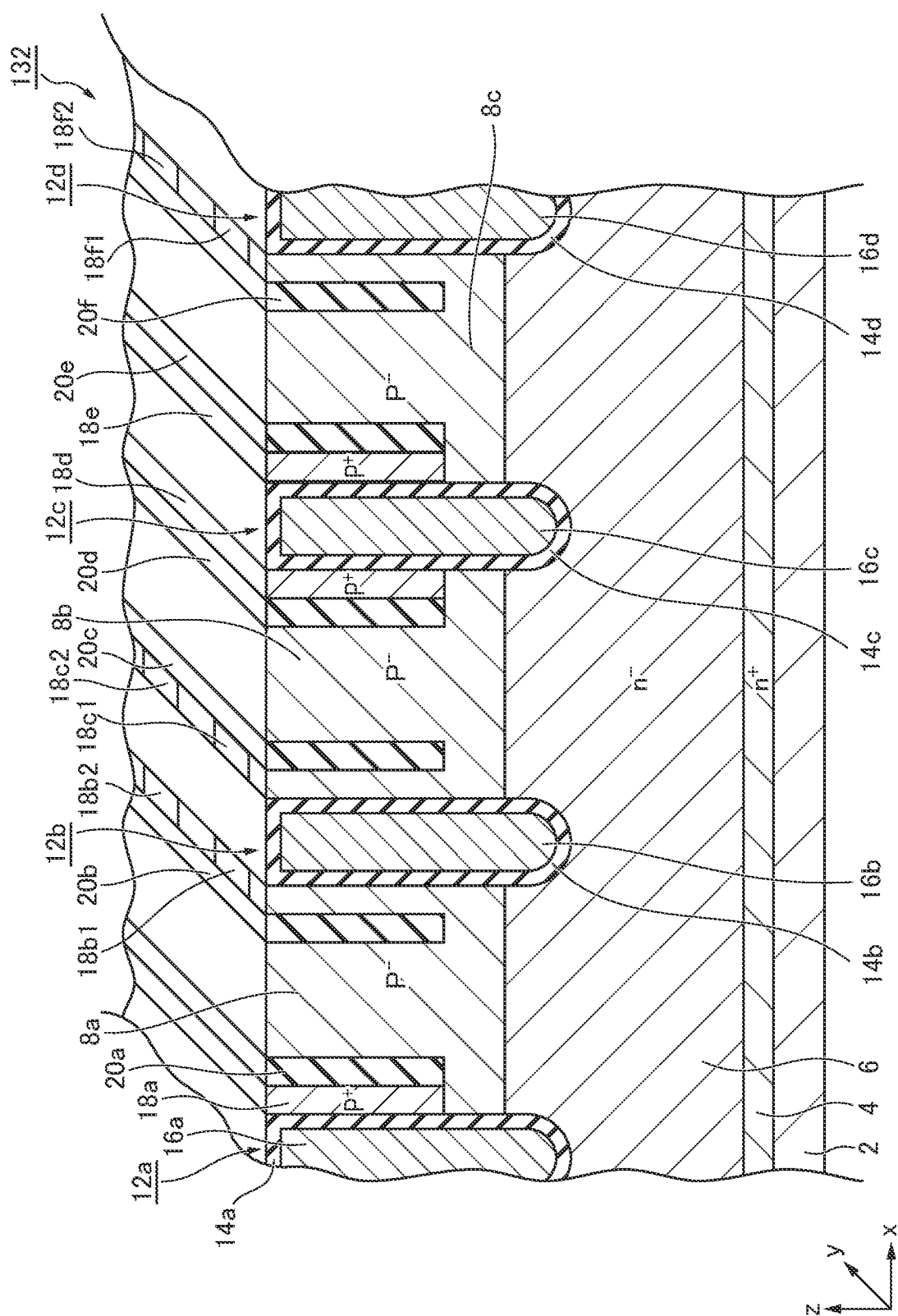
FIG. 13 is a schematic perspective view of a semiconductor device of a first modification of the fourth embodiment.
Figure 14:
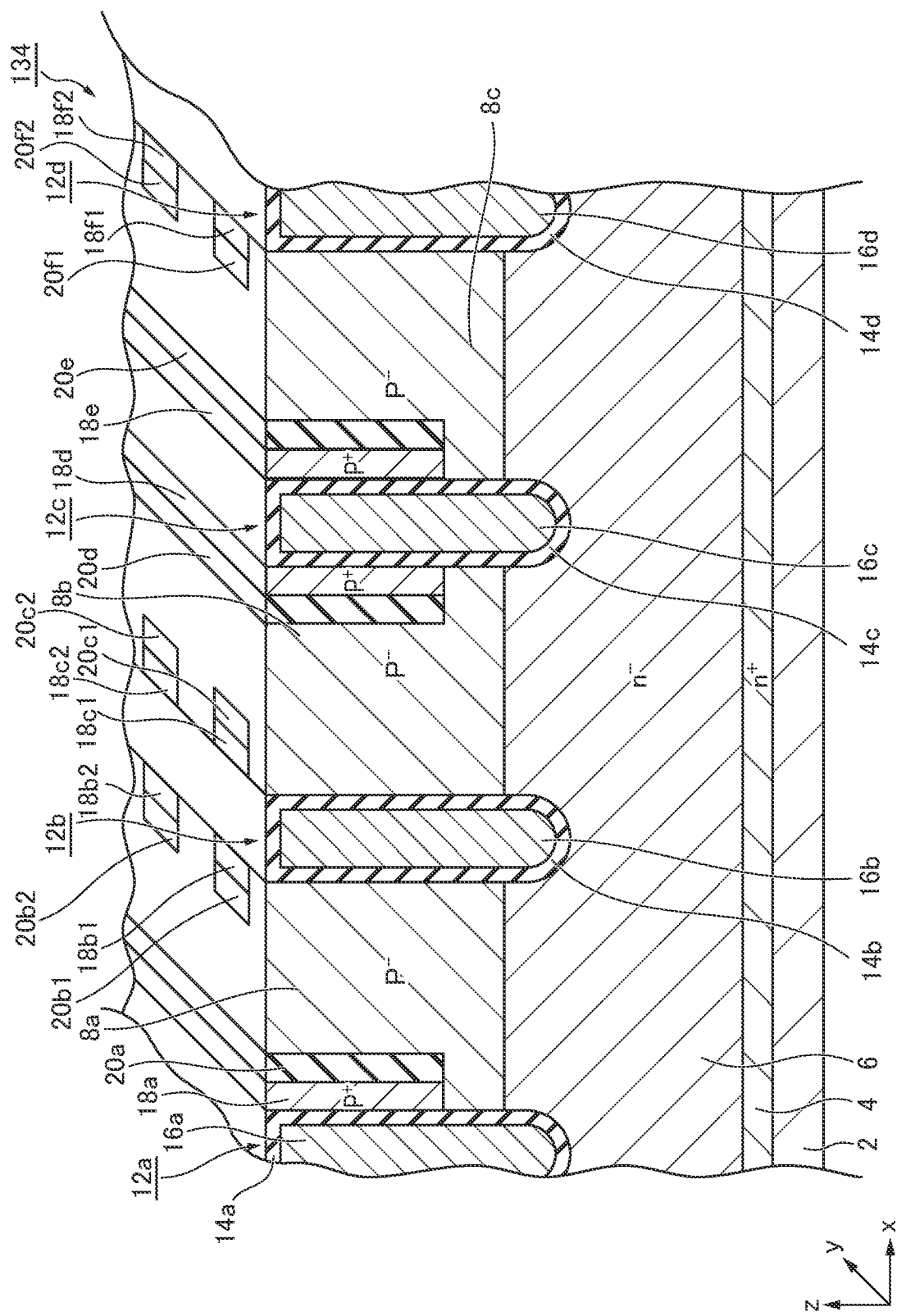
FIG. 14 is a schematic perspective view of a semiconductor device of a second modification of the fourth embodiment.

The insulating film 20a, the insulating film 20b, the insulating film 20c, the insulating film 20d, the insulating film 20e, and the insulating film 20f extend in the Y direction. The lengths of the semiconductor region 18b, the semiconductor region 18c, and the semiconductor region 18f in the Y direction are shorter than the lengths of the semiconductor region 18a, the semiconductor region 18e, and the semiconductor region 18f in the Y direction. Further, FIG. 13 is a schematic perspective view of a semiconductor device 132 of a first modification of the embodiments. Semiconductor device 132 includes a plurality of semiconductor regions 18 so as to be separated from each other in the anode layer 8. The semiconductor device 132 includes a semiconductor region $18b_1$ and a semiconductor region $18b_2$. The semiconductor device 132 includes a semiconductor region $18c_1$ and a semiconductor region $18c_2$. The semiconductor device 132 includes a semiconductor region $18f_1$ and a semiconductor region $18f_2$. Further, FIG. 14 is a schematic perspective view of a semiconductor device 134 of a second modification of the embodiments. Semiconductor device 134 includes a plurality of semiconductor regions 18 so as to be separated from each other in the anode layer 8, and a plurality of insulating films 20 so as to be separated from each other in the anode layer 8. The semiconductor device 132 includes an insulating film $20b_1$ and an insulating film $20b_2$. The semiconductor device 132 includes an insulating film $20c_1$ and an insulating film $20c_2$. The semiconductor device 132 includes an insulating film $20f_1$ and an insulating film $20f_2$.

In other words, unlike the semiconductor device 110 shown in FIG. 10, in the semiconductor device 130, the insulating film 20b in contact with the semiconductor region 18b, the insulating film 20c in contact with the semiconductor region 18c, and the insulating film 20f in contact with the semiconductor region 18f extend in the Y direction. Therefore, the diffusion of holes in the X direction in the semiconductor region 18 is further suppressed.

Also in the semiconductor device of embodiments, it is possible to provide a semiconductor device in which the recovery loss is reduced and the safe operating range is increased.

Fifth Embodiment

Figure 15:
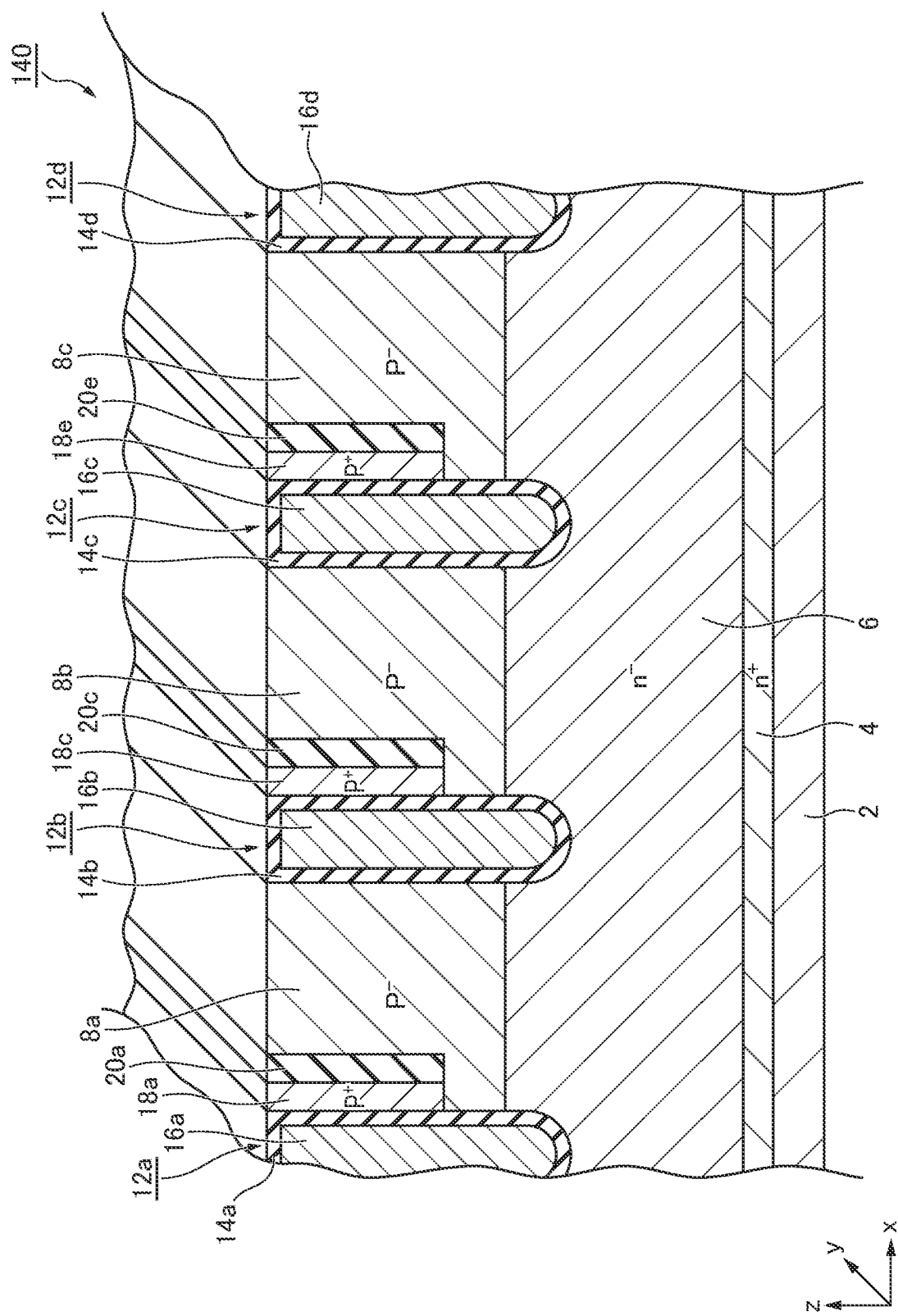
FIG. 15 is a schematic perspective view of a semiconductor device of a fifth embodiment.

FIG. 15 is a schematic perspective view of a semiconductor device 140 of embodiments.

In the semiconductor device 140, the semiconductor region 18a, the semiconductor region 18c, and the semiconductor region 18e are provided. In addition, in the semiconductor device 140, the insulating film 20a, the insulating film 20c, and the insulating film 20e are provided. On the other hand, in the semiconductor device 140, the semiconductor region 18b, the semiconductor region 18d, and the semiconductor region 18f are not provided. In addition, in the semiconductor device 140, the insulating film 20b, the insulating film 20d, and the insulating film 20f are not provided.

Aspects of the semiconductor device of embodiments are as follows. That is, on the paper surface of FIG. 15, the semiconductor region 18 and the insulating film 20 are provided on the side wall provided on the right side of each trench 12. On the other hand, the semiconductor region 18 and the insulating film 20 are not provided on the side wall provided on the left side of each trench 12.

In other words, on the paper surface of FIG. 15, on the side wall provided on the left side of the trench 12b, at least a part of the trench 12b has a portion, which is not in contact with the semiconductor region 18b in the X direction, in the anode layer 8a. In addition, on the paper surface of FIG. 15, on the side wall provided on the left side of the trench 12b, the trench 12b does not have a portion in contact with the semiconductor region 18b in the X direction.

In other words, on the paper surface of FIG. 15, on the side wall provided on the left side of the trench 12c, at least a part of the trench 12c has a portion, which is not in contact with the semiconductor region 18c in the X direction, in the anode layer 8b. In addition, on the paper surface of FIG. 15, on the side wall provided on the left side of the trench 12c, the trench 12c does not have a portion in contact with the semiconductor region 18c in the X direction.

In other words, on the paper surface of FIG. 15, on the side wall provided on the left side of the trench 12d, at least a part of the trench 12d has a portion, which is not in contact with the semiconductor region 18d in the X direction, in the anode layer 8c. In addition, on the paper surface of FIG. 15, on the side wall provided on the left side of the trench 12d, the trench 12d does not have a portion in contact with the semiconductor region 18d in the X direction.

In the semiconductor device 140 of embodiments, since the volume of the semiconductor region 18 is smaller than that of the semiconductor device 100 according to the first embodiment, the amount of holes injected into the semiconductor device is reduced. Therefore, it is possible to reduce the hole injection on the anode side.

Also in the semiconductor device of embodiments, it is possible to provide a semiconductor device in which the recovery loss is reduced and the safe operating range is increased.

Sixth Embodiment

Figure 16:
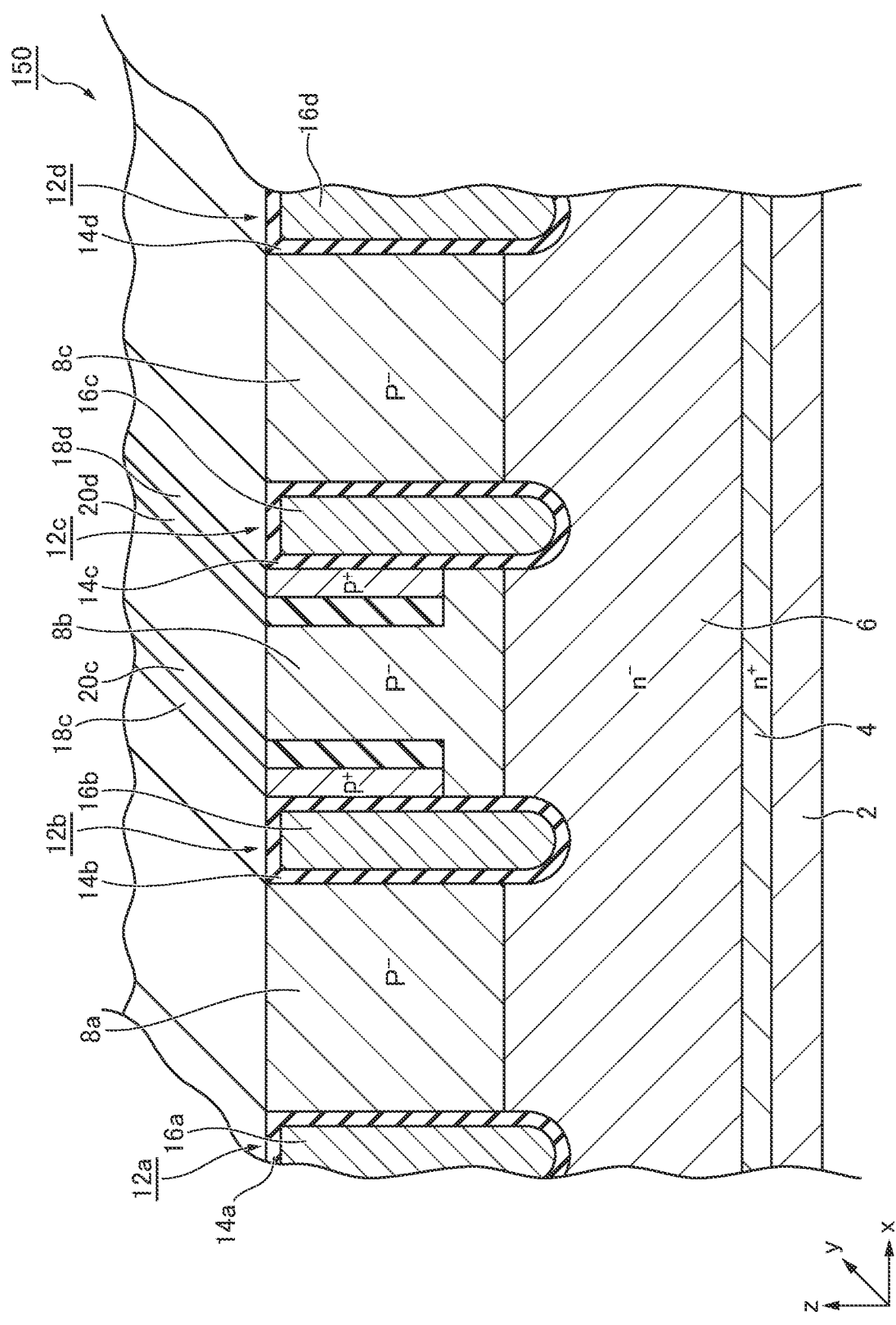
FIG. 16 is a schematic perspective view of a semiconductor device of a sixth embodiment.

FIG. 16 is a schematic perspective view of a semiconductor device 150 of embodiments.

In the semiconductor device 150, the semiconductor region 18c and the semiconductor region 18d are provided. In addition, in the semiconductor device 150, the insulating film 20c and the insulating film 20d are provided. On the other hand, in the semiconductor device 150, the semiconductor region 18a, the semiconductor region 18b, the semiconductor region 18e, and the semiconductor region 18f are not provided. In addition, in the semiconductor device 150, the insulating film 20a, the insulating film 20b, the insulating film 20e, and the insulating film 20f are not provided.

In the semiconductor device 150 of embodiments, the insulating film 20*c* and the insulating film 20*d* are provided so as to face each other in the X direction with the anode layer 8*b* interposed between the insulating film 20*c* and the insulating film 20*d*. In addition, the semiconductor region 18*c* and the semiconductor region 18*d* are provided so as to face each other in the X direction with the anode layer 8*b* interposed between the semiconductor region 18*c* and the semiconductor region 18*d*. On the other hand, the semiconductor region 18 and the insulating film 20 are not provided in the anode layer 8*a* and the anode layer 8*c*, respectively.

In other words, on the paper surface of FIG. 16, on the side wall provided on the right side of the trench 12*a*, at least a part of the trench 12*a* has a portion, which is not in contact with the semiconductor region 18*a* in the X direction, in the anode layer 8*a*. In addition, on the paper surface of FIG. 16, on the side wall provided on the right side of the trench 12*a*, the trench 12*a* does not have a portion in contact with the semiconductor region 18*a* in the X direction.

In other words, on the paper surface of FIG. 16, on the side wall provided on the left side of the trench 12*b*, at least a part of the trench 12*b* has a portion, which is not in contact with the semiconductor region 18*b* in the X direction, in the anode layer 8*a*. In addition, on the paper surface of FIG. 16, on the side wall provided on the left side of the trench 12*b*, the trench 12*a* does not have a portion in contact with the semiconductor region 18*b* in the X direction.

In other words, on the paper surface of FIG. 16, on the side wall provided on the right side of the trench 12*c*, at least a part of the trench 12*c* has a portion, which is not in contact with the semiconductor region 18*e* in the X direction, in the anode layer 8*c*. In addition, on the paper surface of FIG. 16, on the side wall provided on the right side of the trench 12*c*, the trench 12*c* does not have a portion in contact with the semiconductor region 18*e* in the X direction.

In other words, on the paper surface of FIG. 16, on the side wall provided on the left side of the trench 12*d*, at least a part of the trench 12*d* has a portion, which is not in contact with the semiconductor region 18*f* in the X direction, in the anode layer 8*c*. In addition, on the paper surface of FIG. 16, on the side wall provided on the left side of the trench 12*d*, the trench 12*d* does not have a portion in contact with the semiconductor region 18*f* in the X direction.

Also in the semiconductor device 150 of embodiments, since the volume of the semiconductor region 18 is smaller than that of the semiconductor device 100 according to the first embodiment, the amount of holes injected into the semiconductor device is reduced. Therefore, it is possible to reduce the hole injection on the anode side.

Also in the semiconductor device of embodiments, it is possible to provide a semiconductor device in which the recovery loss is reduced and the safe operating range is increased.

Seventh Embodiment

A semiconductor device of embodiments is different from the semiconductor devices of the first to sixth embodiments in that the semiconductor device of embodiments includes: a second trench that extends from a second semiconductor layer toward a first semiconductor layer but does not reach the first semiconductor layer and are provided so as to be separated from a first insulating film; a second semiconductor region provided in the second semiconductor layer so as to be in contact with the second trench and having a higher concentration of impurities of second conductivity type than the second semiconductor layer; and a second insulating film provided in the second semiconductor layer so as to be in contact with the second semiconductor region. Here, the description of the content overlapping the first to sixth embodiments will be omitted.

Figure 17:
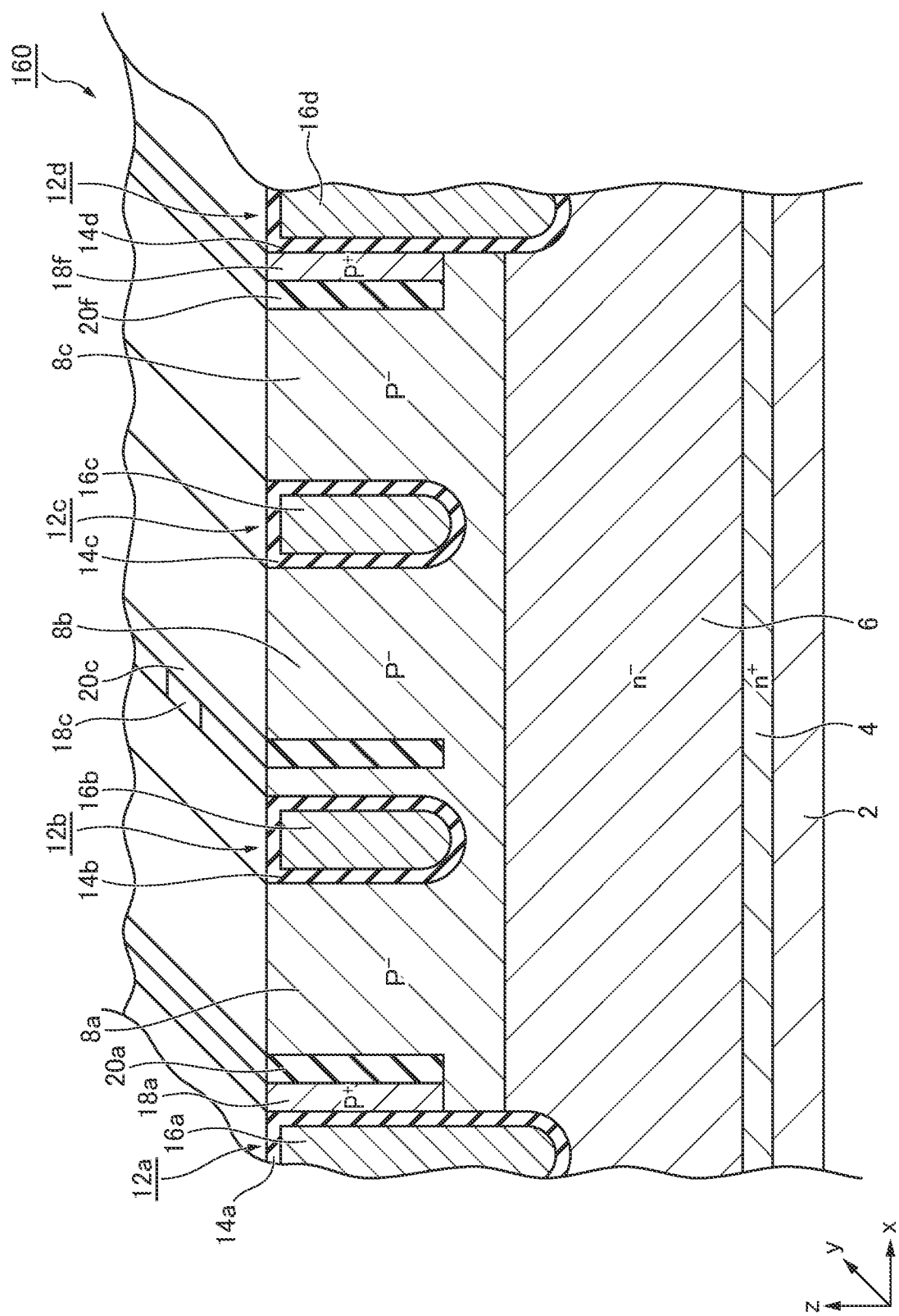
FIG. 17 is a schematic perspective view of a semiconductor device of a seventh embodiment.

FIG. 17 is a schematic perspective view of a semiconductor device 160 of embodiments. The trench 12*b* (an example of the second trench) and the trench 12*c* do not reach the drift layer 6. In other words, the bottom of the trench 12*b* and the bottom of the trench 12*c* are provided in the anode layer 8. On the other hand, the trench 12*a* and the trench 12*d* reach the drift layer 6.

In addition, the semiconductor region 18*a* in contact with the side wall of the trench 12*a* and the semiconductor region 18*f* in contact with the side wall of the trench 12*d* are provided. On the other hand, the length of the semiconductor region 18*c* (an example of the third semiconductor region) provided in contact with the side wall of the trench 12*b* in the Y direction is shorter than the length of the semiconductor region 18*a* in the Y direction. In addition, in the semiconductor device 160, the semiconductor region 18*b*, the semiconductor region 18*d*, and the semiconductor region 18*e* are not provided. The semiconductor region 18*c* may extend in the Y direction along the side wall of the trench 12*b*. In other words, the length of the semiconductor region 18*c* in the Y direction may be equal to the length of the semiconductor region 18*a* in the Y direction. In addition, the length of the insulating film 20*c* (an example of the second insulating film) in the Y direction may be equal to, for example, the length of the semiconductor region 18*c* in the Y direction. In addition, for example, a plurality of semiconductor regions 18*c* separated from each other may be provided in contact with the side wall of the trench 12*b* along the Y direction. For example, a plurality of insulating films 20*c* separated from each other may be provided in contact with the plurality of semiconductor regions 18*c* along the Y direction.

In other words, on the paper surface of FIG. 17, on the side wall provided on the left side of the trench 12*b*, at least a part of the trench 12*b* has a portion, which is not in contact with the semiconductor region 18*b* in the X direction, in the anode layer 8*a*. In addition, on the paper surface of FIG. 16, on the side wall provided on the left side of the trench 12*b*, the trench 12*a* does not have a portion in contact with the semiconductor region 18*b* in the X direction.

In other words, on the paper surface of FIG. 17, on the side wall provided on the left side of the trench 12*c*, at least a part of the trench 12*c* has a portion, which is not in contact with the semiconductor region 18*d* in the X direction, in the anode layer 8*b*. In addition, on the paper surface of FIG. 16, on the side wall provided on the left side of the trench 12*b*, the trench 12*a* does not have a portion in contact with the semiconductor region 18*b* in the X direction.

In other words, on the paper surface of FIG. 17, on the side wall provided on the right side of the trench 12*c*, at least a part of the trench 12*c* has a portion, which is not in contact with the semiconductor region 18*e* in the X direction, in the anode layer 8*c*. In addition, on the paper surface of FIG. 17, on the side wall provided on the right side of the trench 12*c*, the trench 12*c* does not have a portion in contact with the semiconductor region 18*e* in the X direction.

In order to increase the discharge of holes generated by avalanche breakdown, it is preferable to cause the avalanche breakdown at the bottom of the trench 12*a* and the bottom of the trench 12*d*, which are longer in the Z direction than the trench 12*b* and the trench 12*c*, so that the holes are removed satisfactorily. When the semiconductor region 18*c* having a short length in the Y direction is provided, the proportion of the p$^+$-type semiconductor region 18 is reduced. Therefore, it is possible to reduce the hole injection on the anode side. On the other hand, during recovery, the amount of holes discharged in the vicinity of the trench 12b in which the semiconductor region 18c is provided decreases. That is, during recovery, it is necessary to discharge holes in the vicinity of the trench 12a and the trench 12d. In embodiments, avalanche breakdown is likely to occur at the bottom of the trench 12a and the bottom of the trench 12d, which are longer in the Z direction than the trench 12b and the trench 12c. Therefore, the holes generated by the avalanche breakdown can be effectively discharged. This is to make it easy to discharge holes from the bottom of the trench more stably than a trench structure having the same length as a whole. On the other hand, in the trench 12b and the trench 12c that are short in the Z direction, the avalanche breakdown at the bottom of the trench is unlikely to occur, so that the hole discharge path may be short.

Also in the semiconductor device of embodiments, it is possible to provide a semiconductor device in which the recovery loss is reduced and the safe operating range is increased.

While certain embodiments have been described, these embodiments have been presented by way of example only, and are not intended to limit the scope of the inventions. Indeed, Semiconductor Device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first electrode;
   a first semiconductor layer of first conductivity type provided on the first electrode;
   a second semiconductor layer of second conductivity type provided on the first semiconductor layer;
   a second electrode provided on the second semiconductor layer;
   a first trench reaching the first semiconductor layer from the second semiconductor layer;
   a first semiconductor region provided in the second semiconductor layer, the first semiconductor region being in contact with the first trench and the first semiconductor region having a higher concentration of impurities of second conductivity type than the second semiconductor layer; and
   a first insulating film provided in the second semiconductor layer and the first insulating film being in contact with the first semiconductor region.

2. The semiconductor device according to claim 1, wherein a length of the first insulating film in a first direction from the first semiconductor layer to the second semiconductor layer is 0.6 times or more and 1.5 times or less a length of the first semiconductor region in the first direction.

3. The semiconductor device according to claim 1, wherein a length of the second semiconductor layer in a first direction from the first semiconductor layer to the second semiconductor layer is longer than a length of the first insulating film in the first direction.

4. The semiconductor device according to claim 1, wherein a length of the second semiconductor layer in a first direction from the first semiconductor layer to the second semiconductor layer is longer than a length of the first semiconductor region in the first direction.

5. The semiconductor device according to claim 1, wherein the first insulating film contains silicon oxide.

6. The semiconductor device according to claim 1, further comprising:
   a plurality of the first semiconductor regions provided in the second semiconductor layer and the first semiconductor regions being separated from each other.

7. The semiconductor device according to claim 1, further comprising:
   a plurality of the first semiconductor regions provided in the second semiconductor layer and the first semiconductor regions being separated from each other; and
   a plurality of the first insulating films provided in the second semiconductor layer and the first insulating films being separated from each other.

8. The semiconductor device according to claim 1, further comprising:
   a second trench extending from the second semiconductor layer toward the first semiconductor layer, the second trench being in contact with the second semiconductor layer in a second direction crossing a first direction from the first semiconductor layer to the second semiconductor layer;
   a second semiconductor region provided in the second semiconductor layer, the second semiconductor region being in contact with the second trench and the second semiconductor region having a higher concentration of impurities of second conductivity type than the second semiconductor layer; and
   a second insulating film provided in the second semiconductor layer and the second insulating film being in contact with the second semiconductor region.

9. The semiconductor device according to claim 8, wherein the first trench and the second trench extend in a third direction crossing the first and second directions, and
   a length of the second semiconductor region in the third direction is shorter than a length of the first semiconductor region in the third direction.

10. The semiconductor device according to claim 9, wherein the length of the second semiconductor region in the third direction is shorter than a length of the second insulating film in the third direction.

11. The semiconductor device according to claim 9, further comprising:
    a plurality of the second semiconductor regions provided in the second semiconductor layer and the second semiconductor regions being separated from each other.

12. The semiconductor device according to claim 9, further comprising:
    a plurality of the second semiconductor regions provided in the second semiconductor layer and the second semiconductor regions being separated from each other; and
    a plurality of the second insulating films provided in the second semiconductor layer and the second insulating films being separated from each other.

13. The semiconductor device according to claim 8, wherein the second trench reaches the first semiconductor layer.

14. The semiconductor device according to claim 8, wherein a bottom of the second trench is provided in the second semiconductor layer.

15. The semiconductor device according to claim 1, further comprising:
- a second trench extending from the second semiconductor layer toward the first semiconductor layer, the second trench being in contact with the second semiconductor layer in a second direction crossing a first direction from the first semiconductor layer to the second semiconductor layer,
- wherein at least a part of the second trench has a portion in the second semiconductor layer, the portion not being in contact with a second semiconductor region having a higher concentration of impurities of second conductivity type than the second semiconductor layer.

16. The semiconductor device according to claim 11, wherein the second trench has a portion in contact with the second semiconductor region.

* * * * *